| (12) | United States Patent | (10) Patent No.: | US 7,995,407 B2 |
|---|---|---|---|
| | Maki | (45) Date of Patent: | Aug. 9, 2011 |

(54) SEMICONDUCTOR MEMORY DEVICE AND CONTROL METHOD THEREOF

(75) Inventor: Yasuhiko Maki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 233 days.

(21) Appl. No.: 12/177,650

(22) Filed: Jul. 22, 2008

(65) Prior Publication Data

US 2009/0046523 A1    Feb. 19, 2009

(30) Foreign Application Priority Data

Aug. 17, 2007    (JP) ................................. 2007-212999

(51) Int. Cl.
 *G11C 29/00*    (2006.01)

(52) U.S. Cl. .......................... 365/200; 365/226; 365/227

(58) Field of Classification Search .................. 365/200, 365/226, 227

See application file for complete search history.

(56) References Cited

U.S. PATENT DOCUMENTS

| 6,333,877 B1 | 12/2001 | Nagaoka et al. |
| 2007/0002662 A1* | 1/2007 | Yamagami et al. ........... 365/226 |

FOREIGN PATENT DOCUMENTS

JP    2001-195893 A    7/2001

* cited by examiner

*Primary Examiner* — Huan Hoang
(74) *Attorney, Agent, or Firm* — Arent Fox LLP

(57) ABSTRACT

A semiconductor memory device comprising a regular cell array that includes a regular memory cell to which one of a first power supply voltage and a second power supply voltage is supplied and to which a third power supply voltage is supplied, a redundant cell array that includes a redundant memory cell to which one of the first power supply voltage and the second power supply voltage is supplied and to which the third power supply voltage is supplied, and a power supply control circuit that controls supply of the first power supply voltage and the second power supply voltage to the regular cell array and the redundant cell array, wherein a difference between the second power supply voltage and the third power supply voltage is smaller than a difference between the first power supply voltage and the third power supply voltage.

14 Claims, 24 Drawing Sheets

FIG.5

| FUSE (FS1) | (FS0) | FS1 | FS0 | RED0 | RED1 | RED2 | RED3 | BADARY |
|---|---|---|---|---|---|---|---|---|
| ○ | ○ | H | H | L | L | L | H | RARY |
| ○ | × | H | L | L | L | H | L | ARY2 |
| × | ○ | L | H | L | H | L | L | ARY1 |
| × | × | L | L | H | L | L | L | ARY0 |

FIG.6

| | ARY0=○ | ARY1=○ | ARY2=○ | RARY=△ |
|---|---|---|---|---|
| NON REDUNDANT TIME | RED0=L | RED1=L | RED2=L | RED3=H |
| NRML | /RED0=H | /RED1=H | /RED2=H | /RED3=L |
| | VVSS0=VSS | VVSS1=VSS | VVSS2=VSS | VVSS3=VSS+α |
| | ARY0=○ | ARY1=× | ARY2=○ | RARY=○ |
| REDUNDANT TIME | RED0=L | RED1=H | RED2=L | RED3=L |
| NRML | /RED0=H | /RED1=L | /RED2=H | /RED3=H |
| | VVSS0=VSS | VVSS1=VSS+α | VVSS2=VSS | VVSS3=VSS |

FIG.9

| | | ARY0=O | ARY1=O | ARY2=O | RARY=△ |
|---|---|---|---|---|---|
| NON REDUNDANT TIME | NRML | RED0=L | RED1=L | RED2=L | RED3=H |
| | | VVDD0=VDD | VVDD1=VDD | VVDD2=VDD | VVDD3=VDD−α |
| REDUNDANT TIME | NRML | ARY0=O | ARY1=× | ARY2=O | RARY=O |
| | | RED0=L | RED1=H | RED2=L | RED3=L |
| | | VVDD0=VDD | VVDD1=VDD−α | VVDD2=VDD | VVDD3=VDD |

FIG.12

| | | ARY0=○ | ARY1=○ | ARY2=○ | RARY=△ |
|---|---|---|---|---|---|
| NON REDUNDANT TIME | NRML | RED0=L<br>NDA0=H<br>VVSS0=VSS | RED1=L<br>NDA1=H<br>VVSS1=VSS | RED2=L<br>NDA2=H<br>VVSS2=VSS | RED3=H<br>NDA3=L<br>VVSS3=VSS+α |
| | | | SLP=L | | |
| | SLEEP | RED0=L<br>NDA0=L<br>VVSS0=VSS+α | RED1=L<br>NDA1=L<br>VVSS1=VSS+α | RED2=L<br>NDA2=L<br>VVSS2=VSS+α | RED3=H<br>NDA3=L<br>VVSS3=VSS+α |
| | | | SLP=H | | |
| | | ARY0=○ | ARY1=× | ARY2=○ | RARY=○ |
| REDUNDANT TIME | NRML | RED0=L<br>NDA0=H<br>VVSS0=VSS | RED1=H<br>NDA1=L<br>VVSS1=VSS+α | RED2=L<br>NDA2=H<br>VVSS2=VSS | RED3=L<br>NDA3=H<br>VVSS3=VSS |
| | | | SLP=L | | |
| | SLEEP | RED0=L<br>NDA0=L<br>VVSS0=VSS+α | RED1=H<br>NDA1=L<br>VVSS1=VSS+α | RED2=L<br>NDA2=L<br>VVSS2=VSS+α | RED3=L<br>NDA3=L<br>VVSS3=VSS+α |
| | | | SLP=H | | |

FIG.15

| | | ARY0=O | ARY1=O | ARY2=O | RARY=△ |
|---|---|---|---|---|---|
| NON REDUNDANT TIME | NRML | RED0=L<br>NDA0=L<br>VVDD0=VDD | RED1=L<br>NDA1=L<br>VVDD1=VDD | RED2=L<br>NDA2=L<br>VVDD2=VDD | RED3=H<br>NDA3=H<br>VVDD3=VDD-α |
| | | | SLP=L | | |
| | SLEEP | RED0=L<br>NDA0=H<br>VVDD0=VDD-α | RED1=L<br>NDA1=H<br>VVDD1=VDD-α | RED2=L<br>NDA2=H<br>VVDD2=VDD-α | RED3=H<br>NDA3=H<br>VVDD3=VDD-α |
| | | | SLP=H | | |
| REDUNDANT TIME | NRML | ARY0=O | ARY1=× | ARY2=O | RARY=O |
| | | RED0=L<br>NDA0=L<br>VVDD0=VDD | RED1=H<br>NDA1=H<br>VVDD1=VDD-α | RED2=L<br>NDA2=L<br>VVDD2=VDD | RED3=L<br>NDA3=L<br>VVDD3=VDD |
| | | | SLP=L | | |
| | SLEEP | RED0=L<br>NDA0=H<br>VVDD0=VDD-α | RED1=H<br>NDA1=H<br>VVDD1=VDD-α | RED2=L<br>NDA2=H<br>VVDD2=VDD-α | RED3=L<br>NDA3=H<br>VVDD3=VDD-α |
| | | | SLP=H | | |

FIG.17

| | | | | |
|---|---|---|---|---|
| NON REDUNDANT TIME | | ARY0=○ | ARY1=○ | ARY2=○ | RARY=△ |
| NRML | RED0=L | RED1=L | RED2=L | RED3=H |
| | /RED0=H | /RED1=H | /RED2=H | /RED3=L |
| | VVSS0=VSS | VVSS1=VSS | VVSS2=VSS | VVSS3=OPEN |
| REDUNDANT TIME | | ARY0=○ | ARY1=× | ARY2=○ | RARY=○ |
| NRML | RED0=L | RED1=H | RED2=L | RED3=L |
| | /RED0=H | /RED1=L | /RED2=H | /RED3=H |
| | VVSS0=VSS | VVSS1=OPEN | VVSS2=VSS | VVSS3=VSS |

FIG.19

| | | | | |
|---|---|---|---|---|
| NON REDUNDANT TIME | ARY0=○ | ARY1=○ | ARY2=○ | RARY=△ |
| NRML | RED0=L | RED1=L | RED2=L | RED3=H |
| | VVDD0=VDD | VVDD1=VDD | VVDD2=VDD | VVDD3=OPEN |
| REDUNDANT TIME | ARY0=○ | ARY1=× | ARY2=○ | RARY=○ |
| NRML | RED0=L | RED1=H | RED2=L | RED3=L |
| | VVDD0=VDD | VVDD1=OPEN | VVDD2=VDD | VVDD3=VDD |

FIG.21

| | | ARY0=○ | ARY1=○ | ARY2=○ | RARY=△ |
|---|---|---|---|---|---|
| NON REDUNDANT TIME | NRML | RED0=L<br>NDA0=H<br>/RED0=H<br>VVSS0=VSS | SLP=L<br>RED1=L<br>NDA1=H<br>/RED1=H<br>VVSS1=VSS | RED2=L<br>NDA2=H<br>/RED2=H<br>VVSS2=VSS | RED3=H<br>NDA3=L<br>/RED3=L<br>VVSS3=OPEN |
| | SLEEP | RED0=L<br>NDA0=L<br>/RED0=H<br>VVSS0=VSS+α | SLP=H<br>RED1=L<br>NDA1=L<br>/RED1=H<br>VVSS1=VSS+α | RED2=L<br>NDA2=L<br>/RED2=H<br>VVSS2=VSS+α | RED3=H<br>NDA3=L<br>/RED3=L<br>VVSS3=OPEN |
| REDUNDANT TIME | | ARY0=○ | ARY1=× | ARY2=○ | RARY=○ |
| | NRML | RED0=L<br>NDA0=H<br>/RED0=H<br>VVSS0=VSS | SLP=L<br>RED1=H<br>NDA1=L<br>/RED1=L<br>VVSS1=OPEN | RED2=L<br>NDA2=H<br>/RED2=H<br>VVSS2=VSS | RED3=L<br>NDA3=H<br>/RED3=H<br>VVSS3=VSS |
| | SLEEP | RED0=L<br>NDA0=L<br>/RED0=H<br>VVSS0=VSS+α | SLP=H<br>RED1=H<br>NDA1=L<br>/RED1=L<br>VVSS1=OPEN | RED2=L<br>NDA2=L<br>/RED2=H<br>VVSS2=VSS+α | RED3=L<br>NDA3=L<br>/RED3=H<br>VVSS3=VSS+α |

FIG. 23

| | ARY0=O | ARY1=O | ARY2=O | RARY=△ |
|---|---|---|---|---|
| NON REDUNDANT TIME — NRML | RED0=L<br>NDA0=L<br>VVDD0=VDD | SLP=L<br>RED1=L<br>NDA1=L<br>VVDD1=VDD | RED2=L<br>NDA2=L<br>VVDD2=VDD | RED3=H<br>NDA3=H<br>VVDD3=OPEN |
| NON REDUNDANT TIME — SLEEP | RED0=L<br>NDA0=H<br>VVDD0=VDD-α | SLP=H<br>RED1=L<br>NDA1=H<br>VVDD1=VDD-α | RED2=L<br>NDA2=H<br>VVDD2=VDD-α | RED3=H<br>NDA3=H<br>VVDD3=OPEN |
| REDUNDANT TIME — NRML | ARY0=O<br>RED0=L<br>NDA0=L<br>VVDD0=VDD | SLP=L<br>ARY1=×<br>RED1=H<br>NDA1=H<br>VVDD1=OPEN | RED2=L<br>NDA2=L<br>VVDD2=VDD | RARY=O<br>RED3=L<br>NDA3=L<br>VVDD3=VDD |
| REDUNDANT TIME — SLEEP | RED0=L<br>NDA0=H<br>VVDD0=VDD-α | SLP=H<br>RED1=H<br>NDA1=H<br>VVDD1=OPEN | RED2=L<br>NDA2=H<br>VVDD2=VDD-α | RED3=L<br>NDA3=H<br>VVDD3=VDD-α |

SEMICONDUCTOR MEMORY DEVICE AND CONTROL METHOD THEREOF

CROSS-REFERENCE TO RELATED APPLICATIONS

This application claims the benefit of priority from Japanese Patent Application No. 2007-212999 filed on Aug. 17, 2007, the entire contents of which are incorporated herein by reference.

BACKGROUND OF THE INVENTION

1. Field of the Invention

The present application relates to a semiconductor memory including a redundant cell array that relieves a defective cell array.

2. Description of Related Art

Generally, a semiconductor memory such as an SRAM includes memory cells and redundant memory cells. When the memory cells are defective, the defective memory cells are not used, and, instead, the redundant memory cells are used. Replacing the memory cells allows the defective memory cells to be relieved and improves the yield of the semiconductor memories. In other words, the rate of non-defective products is increased. However, the defective memory cells still physically remain after the defective memory cells are relieved. The defective memory cells cause an increase in the leakage current. When a standby current of the semiconductor memory exceeds a certain standard value due to an increase in the leakage current, the semiconductor memory is determined to be a defective product. One method is proposed in order to prevent the leakage current from flowing through the defective memory cell. In the method, a power supply line coupled to a memory cell column including a defective memory cell is set to a floating state. Japanese Laid-open Patent Publication No. 2001-195893 discloses another method. In this method, a ground voltage is supplied to a power supply line coupled to a memory cell column including a defective memory cell.

BRIEF SUMMARY OF THE INVENTION

Aspects of embodiments include providing a semiconductor memory device comprising: a regular cell array that includes a regular memory cell to which one of a first power supply voltage and a second power supply voltage is supplied and to which a third power supply voltage is supplied; a redundant cell array that includes a redundant memory cell to which one of the first power supply voltage and the second power supply voltage is supplied and to which the third power supply voltage is supplied; and a power supply control circuit that controls supply of the first power supply voltage and the second power supply voltage to the regular cell array and the redundant cell array, wherein a difference between the second power supply voltage and the third power supply voltage is smaller than a difference between the first power supply voltage and the third power supply voltage.

Additional advantages and novel features of the invention will be set forth in part in the description that follows, and, in part, will become more apparent to those skilled in the art upon examination of the following or upon learning by practice of the invention.

BRIEF DESCRIPTION OF THE DRAWINGS

FIG. 5 shows an operation of a program circuit according to the third embodiment;
FIG. 6 shows an operation of the third embodiment;
FIG. 9 shows an operation of the fourth embodiment;
FIG. 12 shows an operation of the fifth embodiment;
FIG. 15 shows an operation of the sixth embodiment;
FIG. 17 shows an operation of the seventh embodiment;
FIG. 19 shows an operation of the eighth embodiment;
FIG. 21 shows an operation of the ninth embodiment;
FIG. 23 shows an operation of the tenth embodiment.

DESCRIPTION OF PREFERRED EMBODIMENTS

When a regular memory cell is not a defective memory cell, a redundant memory cell is not used. A slight leakage current flows through the redundant memory cell that is not used. A semiconductor memory including a cell array consisting of the regular memory cells and a cell array consisting of the redundant memory cells relieves the defective memory cells in units of cell arrays. In the above-described semiconductor memory, since the number of the redundant memory cells increases, the leakage current of the redundant memory cells in a current flow at standby mode increases. For the above reason, it is necessary to develop a technique to reduce the leakage current of the redundant memory cells.

Double circles in drawings indicate external terminals. A signal line shown by heavy lines indicate that the number of such signal lines is plural. A portion of a block to which the heavy line is coupled indicates that the portion comprises a plurality of circuits. The same symbols as terminal names are given to signals supplied through the external terminals. In addition, the same symbols as signal names are given to signal lines through which the signals are sent. Signals having a forward slash "/" at the beginning of the signals indicate a negative logic.

Figure 1:
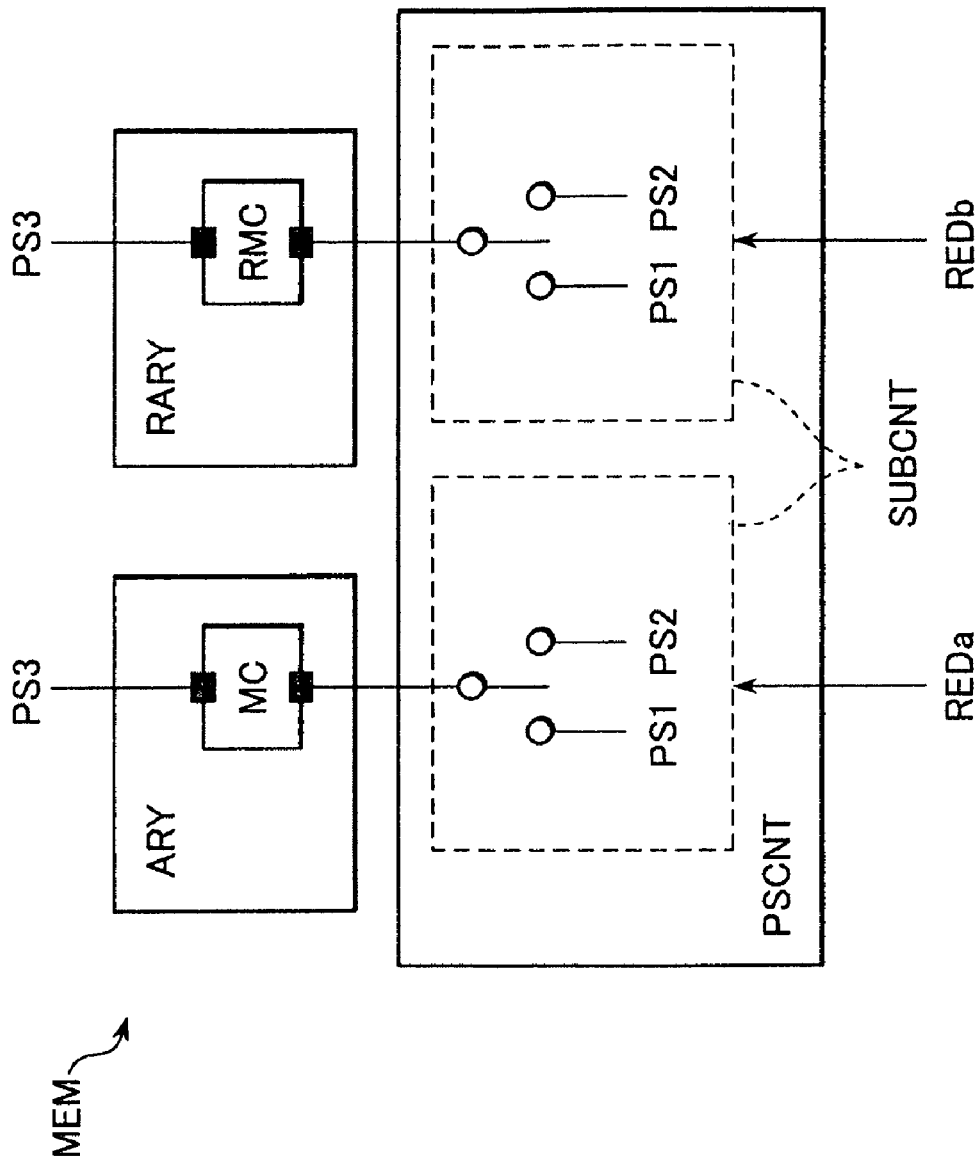
FIG. 1 shows a first embodiment.

FIG. 1 shows a first embodiment. A semiconductor memory MEM includes a regular cell array ARY having a plurality of regular memory cells MC, a redundant cell array RARY having a plurality of redundant memory cells RMC and a power supply control circuit PSCNT. The power supply control circuit PSCNT supplies the regular cell array ARY and the redundant cell array RARY with a first power supply voltage PS1 or a second power supply voltage PS2. The plurality of redundant memory cells RMC are used, instead of defective regular memory cells in the regular cell array ARY. Note that, in some cases, the semiconductor MEM includes more than one regular cell array ARY.

In addition, the regular cell array ARY is not limited to the regular cell array ARY shown in FIG. 1. It is possible that the regular cell array ARY comprises the single regular memory cell MC. It is also possible that the regular cell array ARY comprises the plurality of regular memory cells MC coupled to a single bit line.

The first power supply voltage PS1 and the second power supply voltage PS2 are one of a high level power supply voltage and a low level power supply voltage. A third power supply voltage PS3 is the other of the high level power supply voltage and the low level power supply voltage. The second power supply voltage PS2 is set between the first power supply voltage PS1 and the third power supply voltage PS3. Each of the regular memory cells MC receives one of the first power supply voltage PS1 and the second power supply voltage PS2 at one of a high level power supply terminal and a low level power supply terminal (that is, a first terminal) and the third power supply voltage PS3 at the other of the high level power supply terminal and the low level power supply terminal (that is, a second terminal), so that the regular memory cell MC operates. Each of the redundant memory cells RMC receives one of the first power supply voltage PS1 and the second power supply voltage PS2 at one of a high level power supply terminal and a low level power supply terminal (that is, a third terminal) and the third power supply voltage PS3 at the other of the high level power supply terminal and the low level power supply terminal (that is, a fourth terminal), so that the redundant memory cell RMC operates. Black squares in FIG. 1 indicate the power supply terminals of the regular memory cell MC and of the redundant memory cell RMC.

The power supply control circuit PSCNT includes sub control circuits SUBCNT corresponding to the regular cell array ARY and the redundant cell array RARY, respectively. The sub control circuit SUBCNT corresponding to the regular cell array ARY receives a redundant signal REDa that prohibits the use of the corresponding regular cell array ARY, during a normal operation mode in which access to the regular memory cell MC is permitted. The sub control circuit SUBCNT stops supplying the regular cell array ARY with the first power supply voltage PS1 and, on the other hand, supplies the regular cell array ARY with the second power supply voltage PS2, in response to the received redundant signal REDa. The sub control circuit SUBCNT corresponding to the regular cell array ARY supplies the regular cell array with the first power supply voltage PS1 when it does not receive the redundant signal REDa during the normal operation mode.

The sub control circuit SUBCNT corresponding to the redundant cell array RARY receives a redundant signal REDb that prohibits use of the corresponding redundant cell array RARY during the normal operation mode in which access to the regular memory cell MC is permitted. The sub control circuit SUBCNT stops supplying the redundant cell array RARY with the first power supply voltage PS1 and, on the other hand, supplies the redundant cell array RARY with the second power supply voltage PS2, in response to the redundant signal REDb. The sub control circuit SUBCNT corresponding to the redundant cell array RARY supplies the regular cell array ARY with the first power supply voltage PS1 when it does not receive the redundant signal REDb during the normal operation mode.

In the normal mode operation that permits the access to the regular memory cell MC, when the redundant cell array RARY is not used (That is to say, there is no defective regular cell array), the first power supply voltage PS1 is supplied to the regular cell array ARY and the second power supply voltage PS2 is supplied to the redundant cell array RARY. A difference between the second power supply voltage PS2 and the third power supply voltage PS3 is smaller than a difference between the first power supply voltage PS1 and the third power supply voltage PS3. For the above reason, a difference between the high level power supply voltage and the low level power supply voltage in the unused redundant memory cell RMC becomes smaller. As a result, the leakage current (a power supply current) flowing through the redundant memory cell RMC becomes smaller. When the defective memory cells are relieved in units of cell arrays, the redundant cell array RARY includes the multiple redundant cell arrays RMC. This reduces the leakage current of the unused redundant cell array RARY and reduces a standby current of the memory MEM, as well.

On the other hand, in the normal operation mode, if the redundant cell array RARY is used (that is to say, there is a defective regular cell array), the second power supply voltage PS2 is supplied to the defective regular cell array ARY and the first power supply voltage PS1 is supplied to the redundant cell array RARY. If the regular cell array ARY includes the defective regular memory cell, there is a probability that the regular memory cell MC includes a leakage path that increases the leakage current. For the above reason, a difference between the high level power supply voltage and the low level power supply voltage in the defective regular memory cell MC is reduced. As a result, the leakage current flowing through the regular memory cell MC becomes smaller. Not only the leakage current of the defective regular cell array ARY, which is unused due to the defective regular memory cell included therein, but also the standby current of the memory MEM is reduced.

The sub control circuits SUBCNT are provided corresponding to the regular cell array ARY and the redundant cell array RARY and operate independently with each other, in response to the redundant signal REDa (or REDb). Since the sub control circuits SUBCNT have similar or the same functions as each other, the regular cell array ARY and the redundant cell array RARY may share sub control circuit SUBCNT in common.

It is possible that the power control circuit PSCNT supplies the regular cell array ARY with the first power supply voltage PS1 and, on the other hand, stops supplying the redundant cell array RARY with the first and the second power supply voltages PS1 and PS2, if the redundant cell array RARY is unused during the normal operation mode. In the above case, not only is the leakage current of the unused redundant cell array RARY further reduced, but the standby current of the memory MEM is also greatly reduced.

It is possible that if the redundant cell array RARY is used during the normal operation mode, the power supply control circuit PSCNT stops supplying the defective regular cell array ARY with the first and the second power supply voltages PS1 and PS2, and instead supplies the redundant cell array RARY with the first power supply voltage PS1. In the above case, not only is the leakage current of the defective regular cell array ARY greatly reduced, but the standby current of the memory MEM is also greatly reduced.

The first embodiment supplies the unused redundant cell array RARY with the second power supply voltage PS2 and stops supplying the unused redundant cell array RARY with the first and the second power supply voltages PS1 and PS2. As a result, not only is the leakage current of the redundant cell array RARY reduced, but the standby current of the memory MEM is also reduced. The first embodiment supplies the defective regular cell array ARY with the second power supply voltage PS2 and stops supplying the defective regular cell array ARY with the first and the second power supply voltages PS1 and PS2. As a result, not only is the leakage current of the defective regular cell array ARY reduced, but the standby current of the memory MEM is also reduced.

Figure 2:
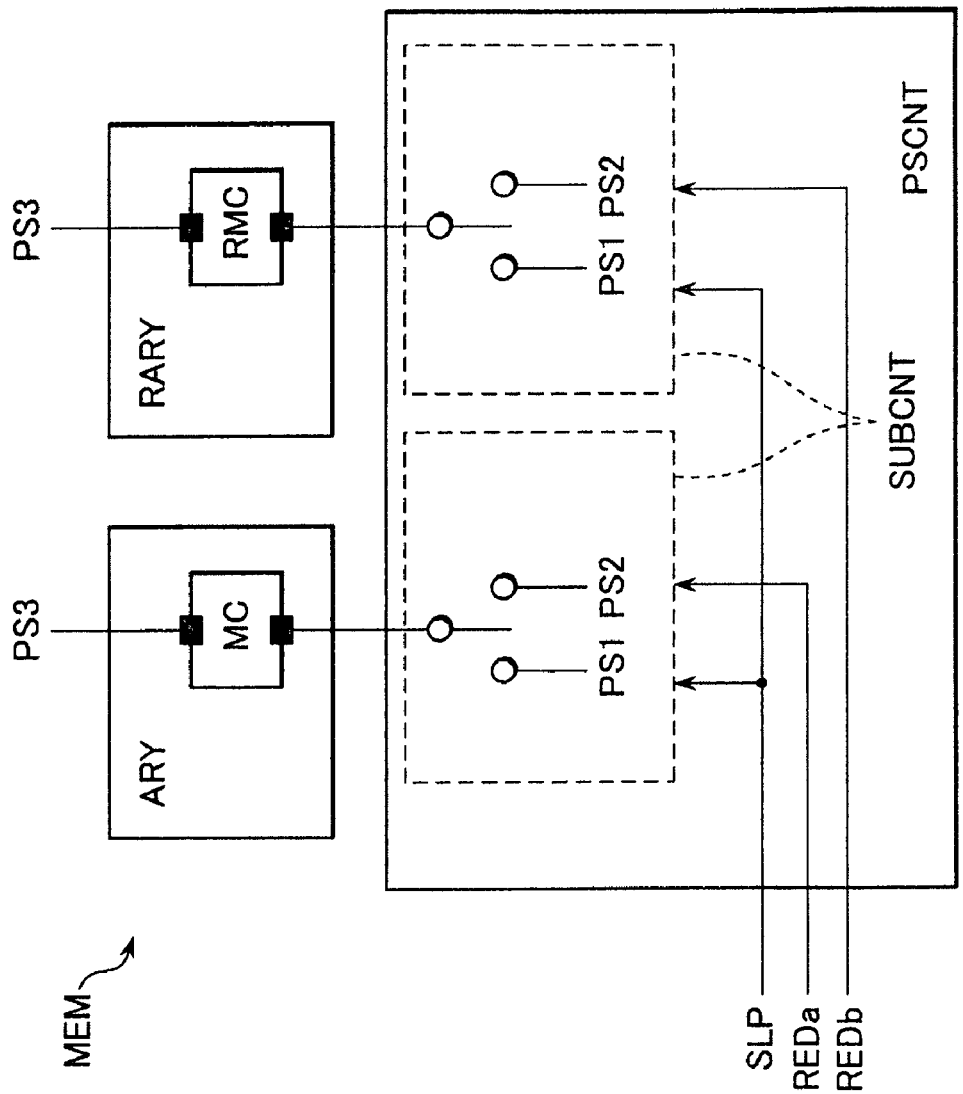
FIG. 2 shows a second embodiment.

FIG. 2 shows a second embodiment. Similar members to those in the foregoing first embodiment are depicted with the same symbols. The structure of a regular cell array ARY and a redundant cell array RARY has the same configurations as that of the first embodiment shown in FIG. 1. In the second embodiment, each of sub control circuits SUBCNT receives a sleep signal SLP in addition to a redundant signal REDa (or REDb). The sleep signal SLP is generated during a sleep mode in which access to a regular memory cell MC is prohibited. It is possible that a semiconductor memory MEM includes more than one regular cell array ARY.

A first power supply voltage PS1 and a second power supply voltage PS2 are one of a high level power supply voltage and a low level power supply voltage. A third power supply voltage PS3 is the other of the high level power supply voltage and the low level power supply voltage. The second power supply voltage PS2 is set between the first power supply voltage PS1 and the third power supply voltage PS3. Each of the regular memory cells MC receives one of the first power supply voltage PS1 and the second power supply voltage PS2 at one of a high level power supply terminal and a low level power supply terminal (that is, a first terminal) and the third power supply voltage PS3 at the other of the high level power supply terminal and the low level power supply terminal (that is, a second terminal), so that the regular memory cell MC operates. Each of the redundant memory cells RMC receives one of the first power supply voltage PS1 and the second power supply voltage PS2 at one of a high level power supply terminal and a low level power supply terminal (that is, a third terminal) and the third power supply voltage PS3 at the other of the high level power supply terminal and the low level power supply terminal (that is, a fourth terminal), so that the redundant memory cell RMC operates. Black squares in FIG. 1 indicate the power supply terminals of the regular memory cell MC and of the redundant memory cell RMC.

When each of the sub control circuits SUBCNT receives the sleep signal SLP or a redundant signal REDa (or REDb), each of the sub control circuits SUBCNT stops supplying the regular cell array ARY (or RARY) with the first power supply voltage PS1 and, instead, supplies the regular cell array ARY (or RARY) with the second power supply voltage PS2. When each of the sub control circuits SUBCNT does not receive the sleep signal SLP and the redundant signal REDa (or REDb), it supplies the regular cell array ARY (or RARY) with the first power supply voltage.

In the sleep mode, the second power supply voltage PS2 is supplied to both of the regular cell array ARY and the redundant cell array RARY. Supply of the second power supply voltage PS2 allows a reduction in leakage current of the regular cell array ARY and the redundant cell array RARY as well as a reduction in consumption current of the memory MEM during the sleep mode (that is to say, a standby current). The operation in the normal operation mode is the same as that of the first embodiment.

A shared power supply control circuit PSCNT switches between supplying the first power supply voltage PS1 and the second power supply voltage PS2 to the unused regular cell array ARY and the unused redundant cell array RARY. The common power supply control circuit PSCNT switches the first power supply voltage PS1 and the second power supply voltage PS2 corresponding to switching of the normal operation mode and the sleep mode. Sharing the same circuit allows a reduction in memory size of the semiconductor memory MEM.

Like the first embodiment, it is possible that the power supply control circuit PSCNT stops supplying the unused redundant cell array RARY or the unused regular cell array ARY with the first power supply voltage PS1 and the second power supply voltage PS2. Thus, the leakage current of the unused regular cell array ARY and the unused redundant cell array RARY is further reduced, and the standby current of the memory MEM is greatly reduced, as well.

The second embodiment provides similar advantages to those in the first embodiment. The second embodiment can reduce the standby current of the memory MEM having the sleep mode. In addition, the second embodiment allows the supply of the first power supply voltage PS1 and the second power supply voltage PS2 to be controlled by using the common sub control circuit SUBCNT. The second embodiment also allows a reduction in the circuit size of the semiconductor memory MEM by sharing the circuit.

Figure 3:
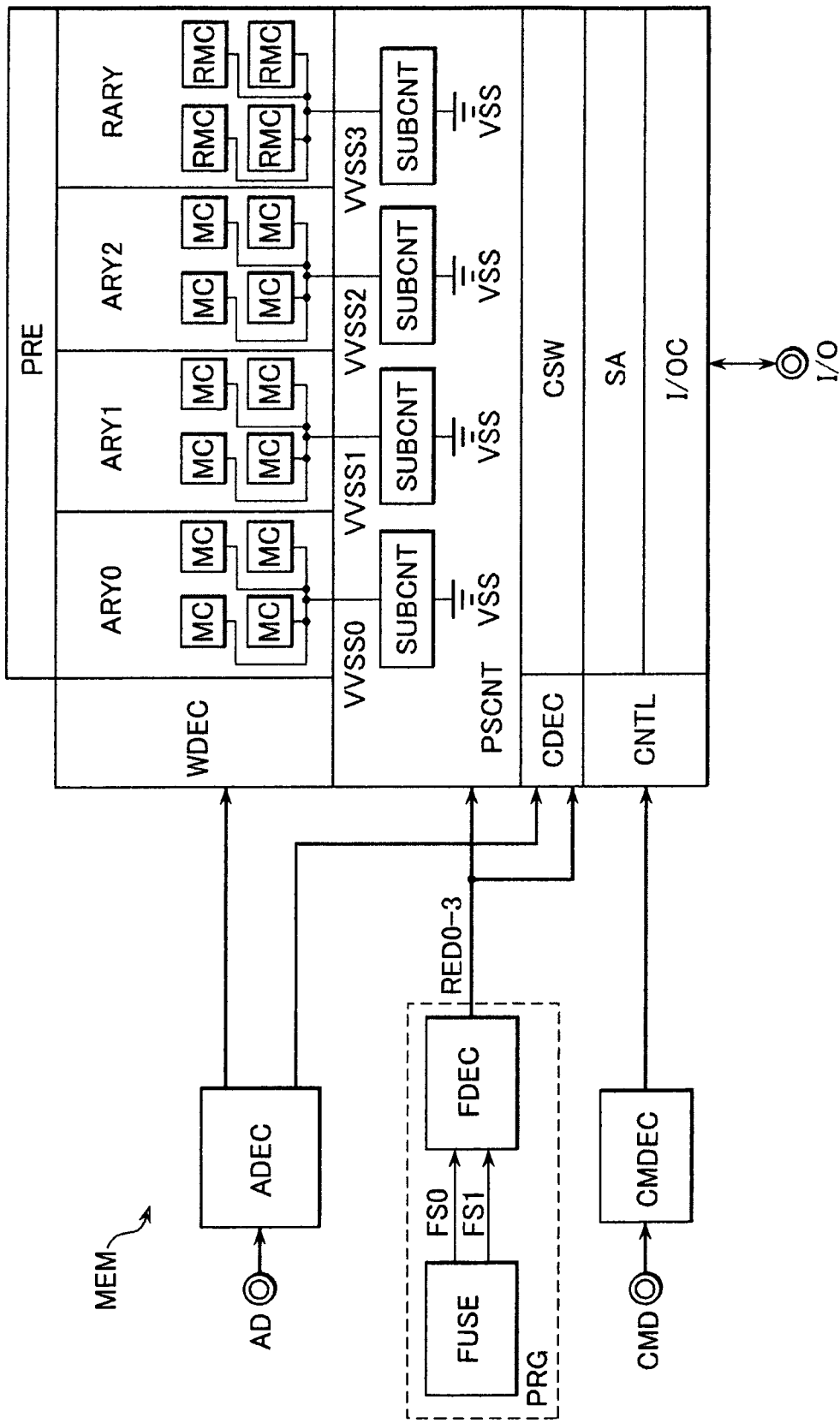
FIG. 3 shows a third embodiment.

FIG. 3 shows a third embodiment. Similar members to those in the foregoing first and second embodiments are depicted with the same symbols. A semiconductor memory MEM is, for example, a static RAM (hereinafter referred to as an "SRAM"). The SRAM is provided as a single semiconductor chip. The SRAM is provided on a system LSI along with controllers such as a CPU, as an SRAM macro. It is possible that the memory MEM operates synchronous with a clock or asynchronous with the clock. The memory MEM includes an address decoder ADEC, a command decoder CMDEC, a program circuit PRG, a word decoder WDEC, a pre-charge circuit PER, regular cell arrays ARY0 through ARY2, a redundant cell array RARY, a power supply control circuit PSCNT, a column decoder CDEC, a column switch CSW, a sense amplifier SA, a data input output control circuit I/OC and an operation control circuit CNTL.

The address decoder ADEC decodes an address signal AD supplied through an address terminal to generate an address decode signal and outputs the address decode signal to the word decoder WDEC and the column decoder CDEC. The command decoder CMDEC decodes a command signal CMD supplied through a command terminal to generate an operation control signal and outputs the operation control signal to the operation control circuit CNTL. For example, the command signal CMD is a control signal necessary for executing a write operation and a read operation on the memory MEM such as a chip select signal, a write enable signal and an output enable signal.

The program circuit PRG includes a fuse circuit FUSE and a fuse decoder FDEC. The fuse circuit FUSE has two fuses and outputs fuse signals FS0 and FS1 in response to program states of the fuses. Logical values of the fuse signals FS0 and FS1 indicate that there is a defective memory cell in the regular cell array ARY (in any of ARY0 through ARAY2) or indicate that there is no defective memory cell in the regular cell arrays ARY (in none of ARY0 and ARY2). The fuse decoder FDEC activates any of redundant signals RED0 through RED3 in response to the fuse signals FS0 and FS1. For example, numerals attached at the end of the redundant signals RED0 through RED3 correspond to numbers of the regular cell arrays ARY0 through ARY3. Based on the activated redundant signals RED0 through RED3, use of the corresponding regular cell arrays ARY0 through ARY3 or the redundant cell array RARY is prohibited. An operation of the program circuit PRG (signals FS0 and FS1, and signals RED0 through RED3) is described in FIG. 5.

During the read operation and the write operation, the word decoder WDEC activates any of word lines WL (FIG. 4) from an L level voltage to an H level voltage, in response to the address decode signal (a row address) from the address decoder ADEC. The L level voltage (a non-selected level) for the word lines WL is a ground voltage VSS (zero (0) V) and the H level voltage (a selected level) for the word lines WL is a power supply voltage VDD (for example, one point two (1.2) V). The ground voltages VSS and VDD are supplied from outside of the memory MEM through an external power supply terminal (not shown) and an external grounding terminal (not shown). For example, the word lines WL are coupled in common to the regular cell arrays ARY0 through ARY2 and the redundant cell array RARY. The regular cell arrays ARY0 through ARY2 and the redundant cell array RARY have similar or the same circuit configurations. Each of the regular cell arrays ARY0 through ARY2 includes a plurality of regular memory cells MC provided in a matrix manner. The memory cells MC in the respective regular cell arrays ARY0 through ARY2 are coupled to a shared virtual ground line VVSS (any of VVSS0 through VVSS2). The redundant cell array RARY includes a plurality of redundant memory cells RMC provided in a matrix manner. The redundant memory cells RMC are coupled to a shared virtual ground line VVSS3.

The pre-charge circuit PRE sets bit lines BL and /BL to pre-charge voltage when the read operation or the write operation is not executed on the regular cell arrays ARY0 through ARY2 or the redundant cell array RARY (in other words, a standby period). The pre-charge voltage is, for example, the power supply voltage VDD.

Figure 4:
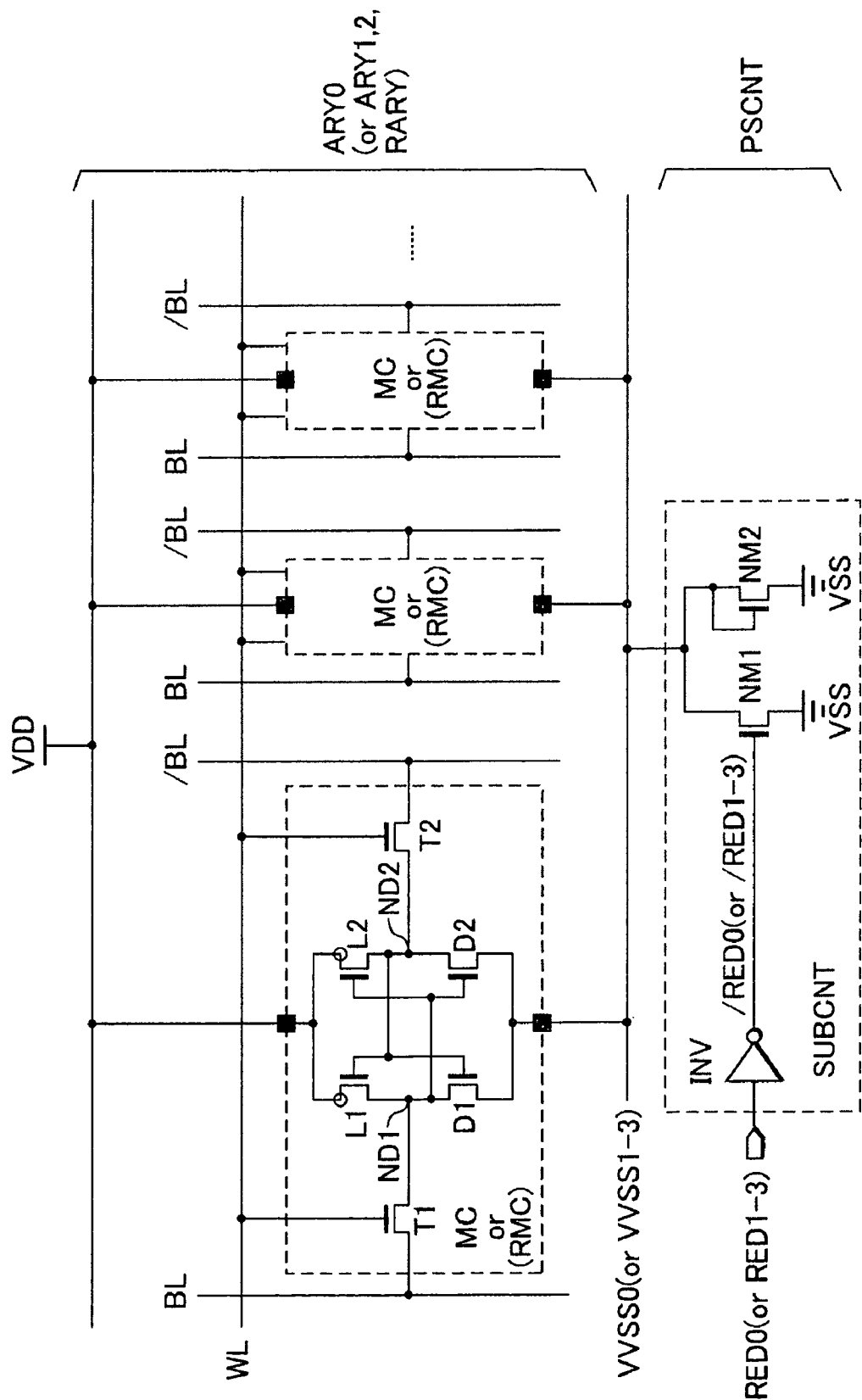
FIG. 4 shows a cell array and a sub control circuit according to the third embodiment.

The power supply control circuit PSCNT includes sub control circuits SUBCNT respectively corresponding to each of the regular cell arrays ARY0 through ARY2 and the redundant cell array RARY. The respective sub control circuits SUBCNT are coupled to any of the virtual ground lines VVSS0 through VVSS3 and the ground line VSS. FIG. 4 shows the sub control circuit SUBCNT.

During the read operation and the write operation, the column decoder CDEC activates a column selection signal to an H level from an L level, in response to the address decode signal (a column address) supplied from the address decoder ADEC. The column selection signal causes a column switch CSW to switch on. Based on the column selection signal, the column switch CSW coupled to a predetermined number of pair of bit lines BL and /BL in the regular cell array ARY (any of ARY0 through ARY2) selected in response to the address signal AD is switched on. Next, data is input to the memory cells MC or the data is output from the memory cells MC. Note that, if there is a defective memory cell(s) in any of the regular cell arrays ARY0 through ARY2, the column decoder CDEC selects the redundant cell array RARY instead of the defective regular cell array(s) ARY, in response to the redundant signals RED0 through RED3.

For example, the predetermined number of pair of bit lines BL and /BL is equal to the number of data terminals I/O. If the number of data terminals I/O is thirty two (32), respective regular cell arrays ARY0 through ARY2 and the redundant cell array RARY include eight (8) column regions (not shown) having thirty two (32) pairs of bit lines BL and /BL. In the read operation or the write operation, the column decoder CDEC outputs the column selection signal to select any of the column regions. In response to the column selection signal, the sixty four (64) column switches CSW coupled to the pair of bit lines BL and /BL are switched on. Then data is read from the thirty two (32) regular memory cells MC or the thirty two (32) redundant memory cells RMC coupled to the switched-on column switches CSW. In addition, the data is written in the thirty two (32) regular memory cells MC or the thirty two (32) redundant memory cells RMC.

Each of the column switches CSW is coupled to the bit lines BL and /BL, respectively. The column switch CSW is switched on in response to the column selection signals to couple the bit lines BL and /BL to a sense amplifier SA. The sense amplifier SA amplifies a read data signal received from the bit lines BL and /BL through the column switches CSW. For example, the number of sense amplifiers is equal to the number of data terminals I/O.

The data input output control circuit I/OC outputs the read data signal supplied from the regular memory cell MC or the redundant memory cell RMC through the column switch CSW during the read operation, to the data terminal I/O. The data input output control circuit I/OC outputs a write data signal received at the data terminal I/O through the column switch CSW during the write operation, to the regular memory cell MC or the redundant memory cell RMC. The operation control circuit CNTL outputs control signals (timing signals) used for controlling the word decoder WDEC, the column decoder CDEC, the sense amplifier SA and the data input output control circuit I/OC, in response to the operation control signal generated by decoding the command signal CMD.

FIG. 4 shows the regular cell arrays ARY0 through ARY2, the redundant cell array RARY and the sub control circuit SUBCNT shown in FIG. 3. Circuit configurations of the regular cell arrays ARY0 through ARY2 and the redundant cell array RARY are similar to each other, however the regular cell arrays ARY0 through ARY2 and the redundant cell array RARY have a difference with respect to the virtual ground lines VVSS0 through VVSS3 to be coupled thereto. Circuit configurations of the sub control circuits SUBCNT coupled to the regular cell arrays ARY0 through ARY2 and the redundant cell array RARY are similar to each other, however, the sub control circuits SUBCNT coupled to the regular cell arrays ARY0 through ARY2 and the redundant cell array RARY have differences with respect to the virtual ground lines VVSS0 through VVSS3 to be grounded thereto and with respect to the redundant signals RED0 through RED3 that are received.

In the regular cell array ARY0 (or in the regular cell arrays ARY1 and ARY2, and in the redundant cell array RARY), the word line WL is coupled to the regular memory cells MC (or the redundant memory cells RMC) provided in a lateral direction in FIG. 4. The pair of bit lines BL and /BL are coupled to the regular memory cells MC (or the redundant memory cells RMC) provided in a longitudinal direction in FIG. 4. Note that, in FIG. 4, the regular memory cells MC and the redundant memory cells provided in the longitudinal direction are omitted. Each of the regular memory cells MC and each of the redundant memory cells RMC include a pair of CMOS inverters (that is, an inverter circuit), a latch LT having a memory nodes ND1 and ND2, and a pair of transfer switches T1 and T2 (nMOS transistors). Either a source or a drain of each of the transfer switches T1 and T2 is coupled to each of the memory nodes ND1 and ND2. The structure of the regular memory cell MC and the redundant memory cell RMC is similar.

The CMOS inverter coupled to the node ND1 includes a load transistor L1 (a pMOS transistor) and a drive transistor D1 (an nMOS transistor). The CMOS inverter coupled to the node ND2 includes a load transistor L2 (a pMOS transistor) and a drive transistor D2 (an nMOS transistor). The regular memory cell MC and the redundant memory cell RMC are static memory cells having six (6) transistors. Sources (power supply terminals) of the load transistors L1 and L2 of the regular memory cell MC are directly coupled to a power supply line VDD via a second terminal shown as a black square in FIG. 4. Sources (grounding terminals) of the drive transistors D1 and D2 in the regular memory cell MC are coupled to the virtual ground line VVSS0 (or virtual ground lines VVSS1 and VVSS2, hereinafter, referred to as a "VVSS") via a first terminal shown as the black square in FIG. 4. Sources (power supply terminals) of the load transistors L1 and L2 of the redundant memory cell RMC are directly coupled to the power supply line VDD via a fourth terminal shown as the black square in FIG. 4. Sources (grounding terminals) of the drive transistors D1 and D2 of the redundant memory cell RMC are coupled to a virtual ground line VVSS (hereinafter, referred to as a "VVSS") via a third terminal shown as the black square in FIG. 4.

The sub control circuit SUBCNT includes nMOS transistors NM1 and NM2 provided in parallel between the virtual ground line VVSS0 (or VVSS1 through VVSS3) and the ground line VSS and an inverter INV coupled to a gate of the nMOS transistor NM1. The inverter INV inverts a logic of the redundant signal RED0 (or RED1 through RED3, hereinafter referred to as a "RED") to output a /RED0 (or /RED1 through /RED3, hereinafter referred to as a "/RED"). A drain and a gate of the nMOS transistor NM2 are coupled. In order to decrease a power supply resistance of the virtual ground line VVSS, multiple nMOS transistors may be provided within the sub control circuit SUBCNT.

When receiving the redundant signal RED having an L level, the sub control circuit SUBCNT causes the nMOS transistor NM1 to switch on and couple the virtual ground line VVSS to the ground line VSS. When receiving the redundant signal RED having an H level, the sub control circuit SUBCNT causes the nMOS transistor NM1 to switch off. Here, since the nMOS transistor NM2 functions as an nMOS diode, the virtual ground line VVSS is set to a voltage value higher than the ground voltage VSS, by a predetermined value. The predetermined value ($\alpha$ shown in FIG. 6) is equal to a threshold voltage value of the nMOS transistor NM2 and is, for example, zero point five (0.5) V.

FIG. 5 shows an operation of the program circuit PRG shown in FIG. 3. Circles in FIG. 5 indicate that fuses (FS0 and FS1) in the fuse circuit FUSE are not programmed (not being cut). Xs in FIG. 5 indicate the fuses of the fuse circuit FUSE are programmed (being cut). When the fuse is not programmed, the fuse circuit FUSE in FIG. 3 outputs the fuse signal FS0 (or FS1) having an H level, and when the fuse is programmed, the fuse circuit FUSE outputs the fuse signal FS0 (or FS1) having an L level.

A two-bit value indicated by the fuse signals FS1 and FS2 indicates the defective regular cell arrays ARY0 through ARY2. Note, however, that "3" (H,H) of the fuse signals FS1 and FS0 indicates that there are no defective regular cell arrays ARY0 and ARY2. In the above case, the redundant cell array RARY is handled as the pseudo defective cell array.

The fuse decoder FDEC in FIG. 3 sets any of the redundant signals RED0 through RED3 at an H level and sets the remaining redundant signals RED at an L level, in response to the fuse signals FS1 and FS0. Numerals attached at the end of the redundant signals RED0 through RED3 indicate a number for the regular cell arrays ARY0 through ARY2 including defective memory cell arrays or a number for the redundant cell array RARY. For example, if the redundant signal RED3 is at the H level, the redundant cell array RARY is handled as the pseudo defective cell array BADARY and use of the redundant cell array RARY is prohibited. If the redundant signal RED2 is at the H level, the regular cell array ARY2 is handled as the defective cell array BADARY, and use of the regular cell array ARY2 is prohibited.

The redundant signals RED0 through RED3 are supplied to the column decoder CDEC in FIG. 3 to replace the defective regular cell array ARY with the redundant cell array RARY. For example, when receiving the redundant signal RED0 having the H level, the column decoder CDEC prohibits its use of the column switches CSW coupled to the regular cell array ARY0 and uses the column switches CSW of the redundant cell array RARY. The column decoder CDEC operates the redundant cell array RARY instead of the regular cell array ARY0. When receiving the redundant signal RED1 having the H level (or RED2), the column decoder CDEC prohibits use of the column switches CSW coupled to the regular cell array ARY1 (or ARY2) and uses the column switches CSW of the redundant cell array RARY. When receiving the redundant signal RED3 having the H level, the column decoder CDEC determines that there is no defective regular cell array ARY and prohibits use of the column switches CSW coupled to the redundant cell array RARY.

FIG. 6 shows an operation of the third embodiment. Circles in FIG. 6 indicate that there is no defect in the regular cell array ARY or in the redundant cell array RARY. A triangle in FIG. 6 indicates that the redundant cell array RARY is handled as the pseudo defective cell array. An X in FIG. 6 indicates the defective regular cell array ARY.

If there is no defective regular memory cell in the regular cell array ARY (non-redundant time), the redundant signal RED3 is set at the H level. In the power supply control circuit PSCNT in FIG. 4, the nMOS transistor NM1 corresponding to the regular cell arrays ARY0 through ARY2 is switched on, and the nMOS transistor NM1 corresponding to the redundant cell array RARY is switched off. The virtual ground lines VVSS0 through VVSS2 are set to the ground voltage VSS (a first power supply voltage) and the virtual ground line VVSS3 is set to a voltage VSS+$\alpha$ (a second power supply voltage). The $\alpha$ indicates a threshold voltage of the nMOS transistor NM2.

An increase in the ground voltage supplied to the unused redundant cell array RARY causes a decrease in difference between the power supply voltage VDD (a third power supply voltage) and the ground voltage in the redundant memory cell RMC in the redundant cell array RARY. For example, if the power supply voltage VDD is one point two (1.2) V and the threshold voltage of the nMOS transistor NM2 is zero point five (0.5) V, the difference between the two voltages is zero point seven (0.7) V. A leakage current (a power supply current) flowing from the power supply line VDD to the ground line VSS through the load transistor L1 and the drive transistor D1 of the redundant memory cell RMC is reduced.

An increase in the ground voltage causes voltages of the memory nodes ND1 and ND2 in the regular memory cell MC shown in FIG. 4 to become higher than a voltage level of ground voltage VSS (0V). For the above reason, a voltage of the word line WL at the non-selected level becomes negative relative to the voltages of the memory nodes ND1 and ND2. This allows a reduction in the leakage current (the power supply current) flowing through the ground line VSS from the bit line BL (or /BL) via the transfer switch T1 (or T2) and node ND1 (or ND2) during the standby period in which the redundant memory cell RMC is not accessed.

If there is a defective regular memory cell in the regular cell array ARY1 (redundant time), since the redundant cell array RARY is used instead of the regular cell array ARY1, for example, the redundant signal RED1 is set to an H level. In the power supply control circuit PSCNT, the nMOS transistor NM1 corresponding to the regular cell arrays ARY0 through ARY2 and the redundant cell array RARY is switched on and the nMOS transistor NM1 corresponding to the regular cell array ARY1 is switched off. The virtual ground lines VVSS0, VVSS2 and VVSS3 are set to the ground voltage VSS while on the other hand the virtual ground line VVSS1 is set to the voltage value VSS+$\alpha$. In consequence, like the non-redundant time, it allows a reduction in the leakage current (the power supply current) of the defective regular cell array ARY1. As a result, a reduction in consumption current (especially, a standby current) is achieved.

The third embodiment includes the same advantages as those in the first embodiment. Since the sub control circuit SUBCNT according to the third embodiment includes the nMOS transistors NM1 and NM2, the third embodiment can generate two types of the ground voltages supplied to the virtual ground lines VVSS0 through VVSS3 only by using the ground voltage VSS. In the third embodiment, since the second power supply voltage (the VSS+α) is generated within the sub control circuit SUBCNT, the memory MEM does not need to receive the second power supply voltage from outside thereof. The third embodiment facilitates the design of a system on which the memory MEM is provided, especially the power supply design for the system.

Figure 7:
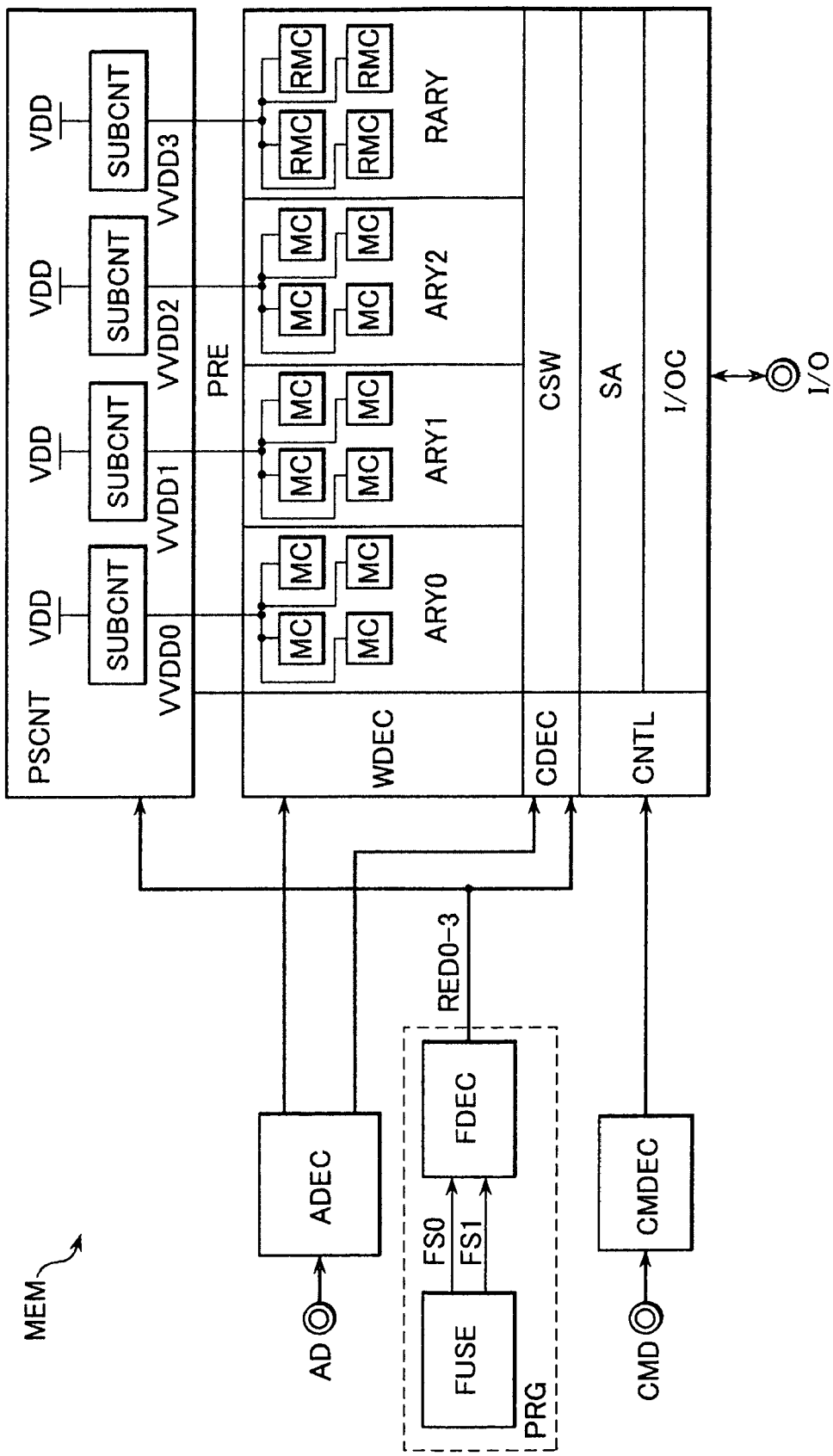
FIG. 7 shows a fourth embodiment.
Figure 8:
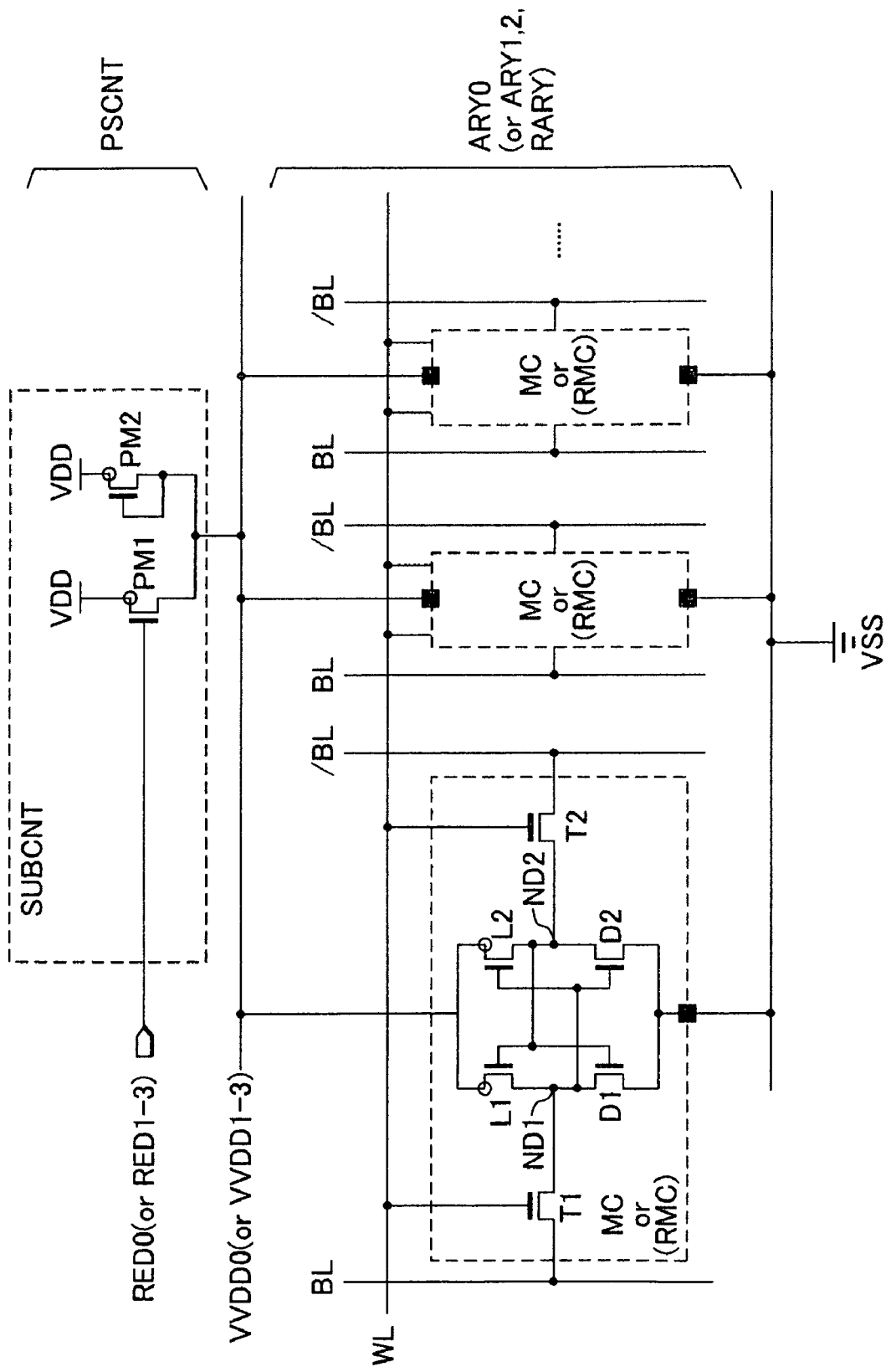
FIG. 8 shows a cell array and a sub control circuit according to the fourth embodiment.

FIG. 7 shows a fourth embodiment. Similar members to those in the foregoing first and third embodiments are depicted with the same symbols. In the fourth embodiment, a power supply control circuit PSCNT is coupled to a virtual power supply lines VVDD0 through VVDD3. As shown in FIG. 8, a power supply terminal (a first terminal) of each of regular memory cells MC is coupled to a power supply line VDD via the virtual power supply lines VVDD0 through VVDD2. A ground terminal (a second terminal) of each of the regular memory cells MC is directly coupled to a ground line VSS. A power supply terminal (a third terminal) of each of redundant memory cells RMC is coupled to the power supply line VDD via the virtual power supply line VVDD3. A ground terminal (a fourth terminal) of each of the redundant memory cells RMC is directly coupled to the ground line VSS. In the fourth embodiment, the structure other than the above is the same as that of the third embodiment. For example, a semiconductor memory MEM is an SRAM. The SRAM is provided as a single semiconductor chip. The SRAM is provided on a system LSI along with controllers such as a CPU, as a SRAM macro. An operation of a program circuit PRG in FIG. 7 is the same as that shown in FIG. 5.

FIG. 8 shows regular cell arrays ARY0 through ARY2, a redundant cell array RARY and a sub control circuit SUBCNT in FIG. 7. Similar members to those in the foregoing third embodiment (FIG. 4) are depicted with the same symbols. The structure of the regular cell arrays ARY0 through ARAY2 and the redundant cell array RARY is similar to each other, however, the regular cell arrays ARY0 through ARAY2 and the redundant cell array RARY have a difference with respect to the virtual power supply lines VVDD0 through VVDD3 coupled thereto. The power supply terminals (the first terminal or the third terminal) of each of the regular memory cells MC and each of the redundant memory cells RMC are coupled to the virtual power supply line VVDD0 (or VVDD1 through VVDD3). The ground terminals (the second terminal or the fourth terminal) of each of the regular memory cells MC and each of the redundant memory cells RMC are directly coupled to the ground line VSS. In the fourth embodiment, the sub control circuit SUBCNT coupled to the regular cell arrays ARY0 through ARY2 and the redundant cell array RARY causes to switch coupling between the power supply line VDD and the virtual power supply lines VVDD0 through VVDD3 in response to the redundant signals RED0 through RED3. Circuit configurations of the sub control circuits SUBCNT are similar to each other, however, the sub control circuits SUBCNT have differences with respect to the virtual power supply lines VVDD0 through VVDD3 coupled thereto and with respect to redundant signals RED0 through RED3 which the sub control circuits receive. The structure of the regular cell arrays ARY0 through ARY2 and the redundant cell array RARY in the fourth embodiment is the same as that of the regular cell arrays ARY0 through ARY2 and the redundant cell array RARY in the first embodiment. The structure of the regular memory cells MC and the redundant memory cells RMC in the fourth embodiment is the same as that of the regular memory cells MC and the redundant memory cells RMC in the first embodiment.

The sub control circuit SUBCNT includes pMOS transistors PM1 and PM2 provided in parallel between the virtual power supply line VVDD0 (or VVDD1 through VVDD3) and the power supply line VDD. A gate of the pMOS transistor PM1 receives the redundant signal RED0 (or RED1 through RED3). A gate and a drain of the pMOS transistor PM2 are coupled with each other. In order to decrease a power supply resistance of the virtual power supply line VVDD0, multiple pMOS transistors may be provided within the sub control circuit SUBCNT.

When receiving the redundant signal RED having an L level, the sub control circuit SUBCNT causes the pMOS transistor PM1 to switch on and couple the virtual power supply line VVDD to the power supply line VDD. When receiving the redundant signal RED having an H level, the sub control circuit SUBCNT causes the pMOS transistor PM1 to switch off. Here, since the pMOS transistor PM2 functions as a pMOS diode, a voltage of the virtual power supply line VVDD is set to a value higher than the ground voltage VDD, by a predetermined value. The predetermined value (α shown in FIG. 9) is equal to a threshold voltage of the pMOS transistor PM2 and, for example, the value is zero point five (0.5) V.

FIG. 9 shows an operation of the fourth embodiment. Symbols such as circles in FIG. 9 have the same meanings as those shown in FIG. 6. The same description of the operation as that of FIG. 6 is reduced or omitted. Logics of the redundant signals RED0 through RED3 are the same as that of the third embodiment.

In the fourth embodiment, if there is no defective regular memory cell in the regular cell array ARY (non-redundant time), the pMOS transistor PM1 corresponding to the regular cell arrays ARY0 through ARY2 is switched on and the pMOS transistor PM1 corresponding to the redundant cell array RARY is switched off. The virtual power supply lines VVDD0 through VVDD2 are set to the ground voltage VDD (a first power supply voltage) and the virtual power supply line VVDD3 is set to a voltage VSS−α (a second power supply voltage).

A decrease in the power supply voltage supplied to the unused redundant cell array RARY causes a decrease in difference between the power supply voltage and the ground voltage VSS (a third power supply voltage) in the redundant memory cells RMC in the redundant cell array RARY. For example, if the power supply voltage is one point two (1.2) V and the threshold voltage of the pMOS transistor PM2 is minus zero point five (−0.5) V, the virtual power supply line VVDD3 is zero point seven (0.7) V and thus the difference between the two voltages is zero point seven (0.7) V. Like the third embodiment, a leakage current (a power supply current) flowing from the power supply line VDD to the ground line VSS via the redundant memory cells RMC is reduced.

If there is a defect in the regular cell array ARY1 (redundant time), for example, the redundant signal RED1 is set at an H level. In the power supply control circuit PSCNT, the pMOS transistor PM1 corresponding to the regular cell arrays ARY0 through ARY2 and the redundant cell array RARY is switched on and the pMOS transistor PM1 corresponding to the regular cell array ARY1 is switched off. The virtual power supply lines VVDD0, VVDD2 and VVDD3 are set to the power supply voltage VDD while on the other hand the virtual power supply line VVDD1 is set to the voltage value VSS−α. Like the non-redundant time, it allows a reduction in the leakage current (the power supply current) of the defective regular cell array ARY1. As a result, a reduction in consumption current (especially, standby current) is achieved.

The fourth embodiment has the same advantages as the first and the third embodiments. Since the sub control circuit SUBCNT in the third embodiment includes the pMOS transistors PM1 and PM2, the fourth embodiment can generate two types of the power supply voltages supplied to the virtual power supply lines VVDD0 through VVDD3 by using only the power supply voltage VDD. The fourth embodiment reduces the consumption current, with a simple circuit.

Figure 10:
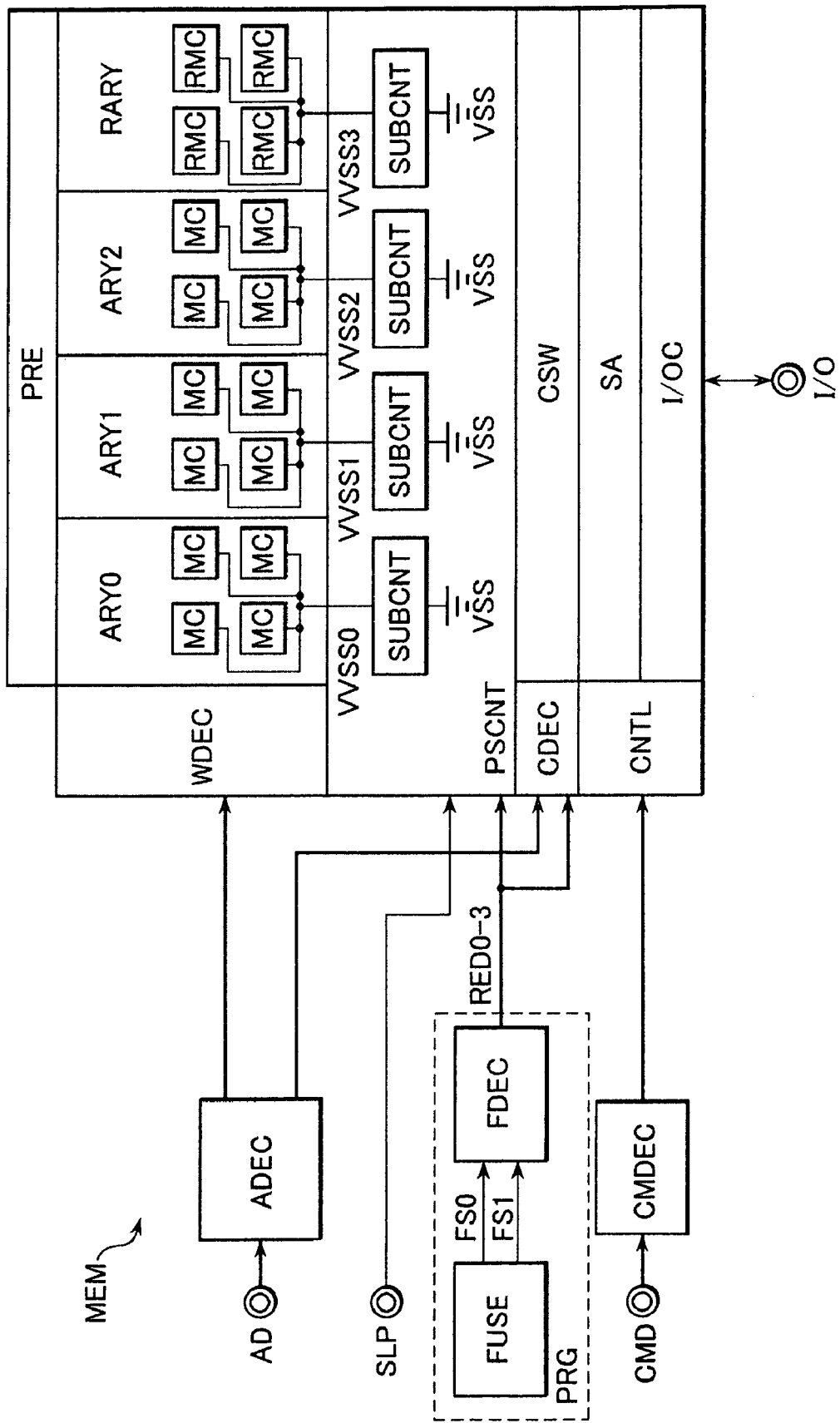
FIG. 10 shows a fifth embodiment.

FIG. 10 shows a fifth embodiment. Similar members as in the foregoing first, second and third embodiments are depicted with the same symbols. In the fifth embodiment, a power supply control circuit PSCNT receives redundant signals RED0 through RED3 and a sleep signal SLP supplied to an external terminal to operate. The structure of the fifth embodiment is the same as that of the third embodiment. For example, a semiconductor memory MEM is an SRAM. The SRAM is provided as a single semiconductor chip. The SRAM is provided on a system LSI with controllers such as a CPU, as an SRAM macro. An operation of a program circuit PRG in FIG. 10 is the same as that shown in FIG. 5. It is possible that the sleep signal SLP is used for reducing a consumption current of functional blocks provided on the system LSI.

The controller (not shown) accessing the memory MEM sets a level of the sleep signal SLP at an L level during a normal operation mode NRML in which access to regular cell arrays ARY and a redundant cell array RARY is permitted. The controller sets the level of the sleep signal SLP at an H level during a sleep mode SLEEP (FIG. 12) in which the access to the regular cell arrays ARY and the redundant cell array RARY is prohibited. While receiving the sleep signal having the H level, the memory MEM enters the sleep mode SLEEP with reduced power consumption. The sleep mode SLEEP is a certain type of a standby mode.

Figure 11:
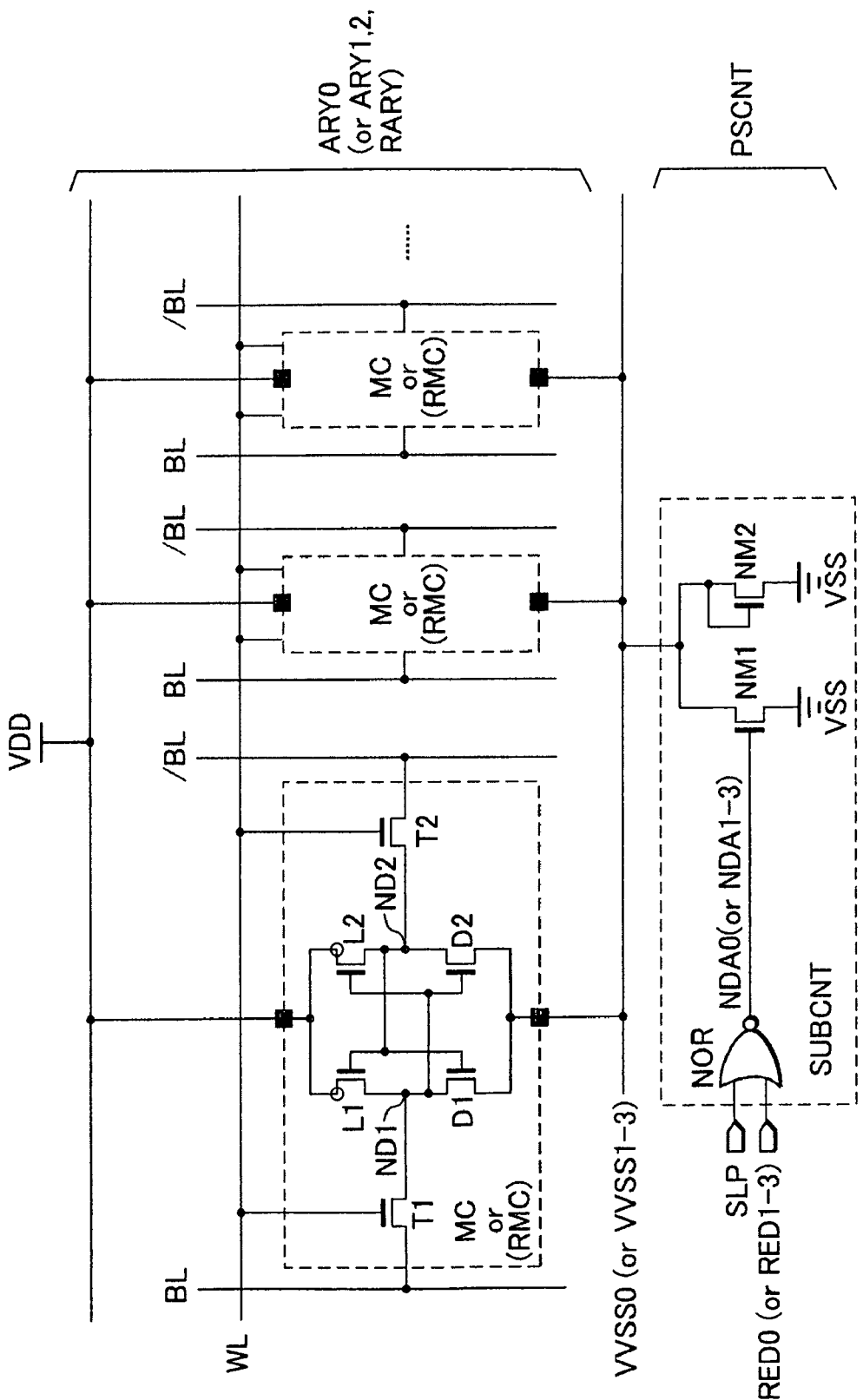
FIG. 11 shows a cell array and a sub control circuit according to the fifth embodiment.

FIG. 11 shows the regular cell arrays ARY0 through ARY2, the redundant cell array RARY and a sub control circuit SUBCNT shown in FIG. 10. Similar members to those in the foregoing third embodiment (FIG. 4) are depicted with the same symbols. The structure of the regular cell arrays ARY0 through ARY2 and the redundant cell array RARY is the same as that of the regular cell arrays ARY0 through ARY2 and the redundant cell array RARY in the first embodiment. The structure of memory cells MC and redundant memory cells RMC is the same as that of the memory cells MC and the redundant memory cells RMC in the first embodiment. Circuit configurations of the sub control circuits SUBCNT coupled to the regular cell arrays ARY0 through ARAY2 or the redundant cell array RARY are similar to each other, however, the sub control circuits SUBCNT coupled to the regular cell arrays ARY0 through ARAY2 or the redundant cell array RARY have differences with respect to virtual ground lines VVSS0 through VVSS3 and with respect to redundant signals RED0 through RED3 which the sub control circuits receive. Black squares in FIG. 10 indicate power supply terminals of the memory cells MC or the redundant memory cells RMC.

The sub control circuit SUNCNT has a circuit configuration in which a NOR gate is added to the circuit configuration of the sub control circuit SUBCNT in the third embodiment. The NOR gate sets a control signal NDA0 (or NDA1 through NDA3) to an L level when any of the redundant signal RED0 (or RED1 through RED3) and the sleep signal SLP is set at an H level. In the fifth embodiment, if any of the cell arrays ARY0 through ARY2 includes a defective regular memory cell MC, if the redundant cell array RARY is handled as the defective cell array or if it is the sleep mode, an nMOS transistor NM1 is switched off. The virtual ground line VVSS0 (or VVSS1 through VVSS3) is set to a voltage VSS+α. This a is equal to a threshold voltage of an nMOS transistor NM2 and is, for example, zero point five (0.5) V.

In order to decrease a power supply resistance of the virtual ground line VVSS, multiple nMOS transistors may be provided within the sub control circuit SUBCNT.

FIG. 12 shows an operation of the fifth embodiment. Symbols such as circles in FIG. 12 have the same meanings as those shown in FIG. 6. Similar description of the operation to that of the third embodiment in FIG. 6 is reduced or omitted. Logics of the redundant signals RED0 through RED3 are the same as those of the third embodiment.

The fifth embodiment has a structure where an operation of the sleep mode SLEEP is added to the operation of the third embodiment (FIG. 6). The operation where the sleep signal SLP is at the L level, (in other words, the operation during the normal operation mode NRML) is similar to that of the third embodiment. However, in the fifth embodiment, the redundant signals /RED0 through RED3 in FIG. 6 are replaced by the control signals NDA0 through NDA3. A power supply voltage VDD (a third power supply voltage) and a ground voltage VSS (a first power supply voltage) are respectively supplied to power supply terminals (a second terminal or a fourth terminal) and ground terminals (a first terminal or a second terminal) of the regular memory cells MC in the regular cell array ARY or the redundant memory cells RMC in the redundant cell array RARY, which are accessed during the normal operation mode NRML. Logics of the control signals NDA0 through NDA3 during the normal operation mode NRML are the same as those of the redundant signals /RED0 through /RED3.

During the sleep mode SLEEP (SLP=H), the control signals NDA0 through NDA3 are set at the L level. Regardless of the logics of the redundant signals RED0 through RED3, all the virtual ground lines VVSS0 through VVSS3 for the regular cell arrays ARY0 through ARY2 and the redundant cell array are set to the voltage VSS+α (a second power supply voltage). A difference between the power supply voltage VDD and the ground voltage, which are respectively supplied to the power supply terminals and the ground terminals of the memory cells MC in the regular cell arrays ARY0 through ARY2 and the redundant memory cells RMC in the redundant cell array RARY, decreases, so that a leakage current (a power supply current) is reduced.

The fifth embodiment has the same advantages as those in the foregoing first, second and third embodiments. The memory MEM in the fifth embodiment reduces a consumption current (a standby current) during the sleep mode SLEEP. The power supply control circuit PSCNT used in a shared manner in the fifth embodiment controls switching of the power supply voltage of the virtual ground lines VVSS0 through VVSS3 by the redundant signals RED0 through RED3 and switching of the power supply voltage of the virtual ground lines VVSS0 through VVSS3 by the sleep signal SLP. This allows not only a reduction in circuit size but also in chip size of the memory MEM.

Figure 13:
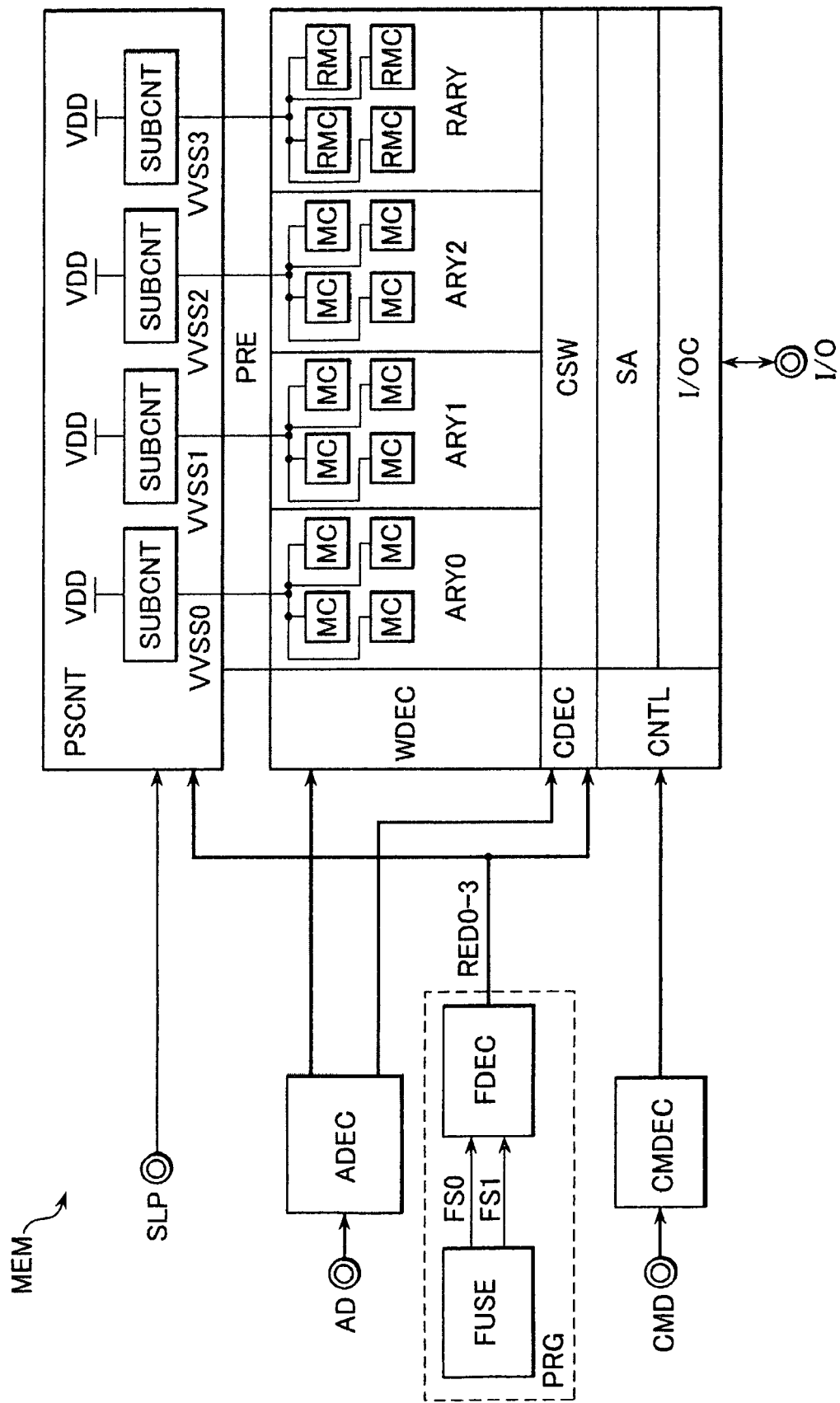
FIG. 13 shows a sixth embodiment.

FIG. 13 shows a sixth embodiment. Similar members to those in the foregoing first through fifth embodiments are depicted with the same symbols. A power supply control circuit PSCNT according to the sixth embodiment receives redundant signals RED0 through RED3 and a sleep signal SLP supplied to an external terminal to operate. The structure of the sixth embodiment, other than the above, is the same as that of the fourth embodiment.

The power supply control circuit PSCNT is coupled to virtual power supply lines VVDD0 through VVDD3. For example, a semiconductor memory MEM is an SRAM. The SRAM is provided as a single semiconductor chip. The SRAM is provided on a system LSI along with controllers such as a CPU, as an SRAM macro. An operation of a program circuit PRG in FIG. 13 is the same as that shown in FIG. 5. It is possible that the sleep signal SLP is used to reduce a power consumption of functional blocks provided on the system LSI.

The controller (not shown) accessing the memory MEM sets the sleep signal SLP to an L level during a normal operation mode NRML in which access to regular cell arrays ARY and a redundant cell array RARY are permitted. The controller sets the sleep signal SLP to an H level during a sleep mode SLEEP in which the access to the regular cell arrays ARY and the redundant cell array RARY are prohibited. The memory MEM enters the sleep mode SLEEP while receiving the sleep signal SLP having the H level.

Figure 14:
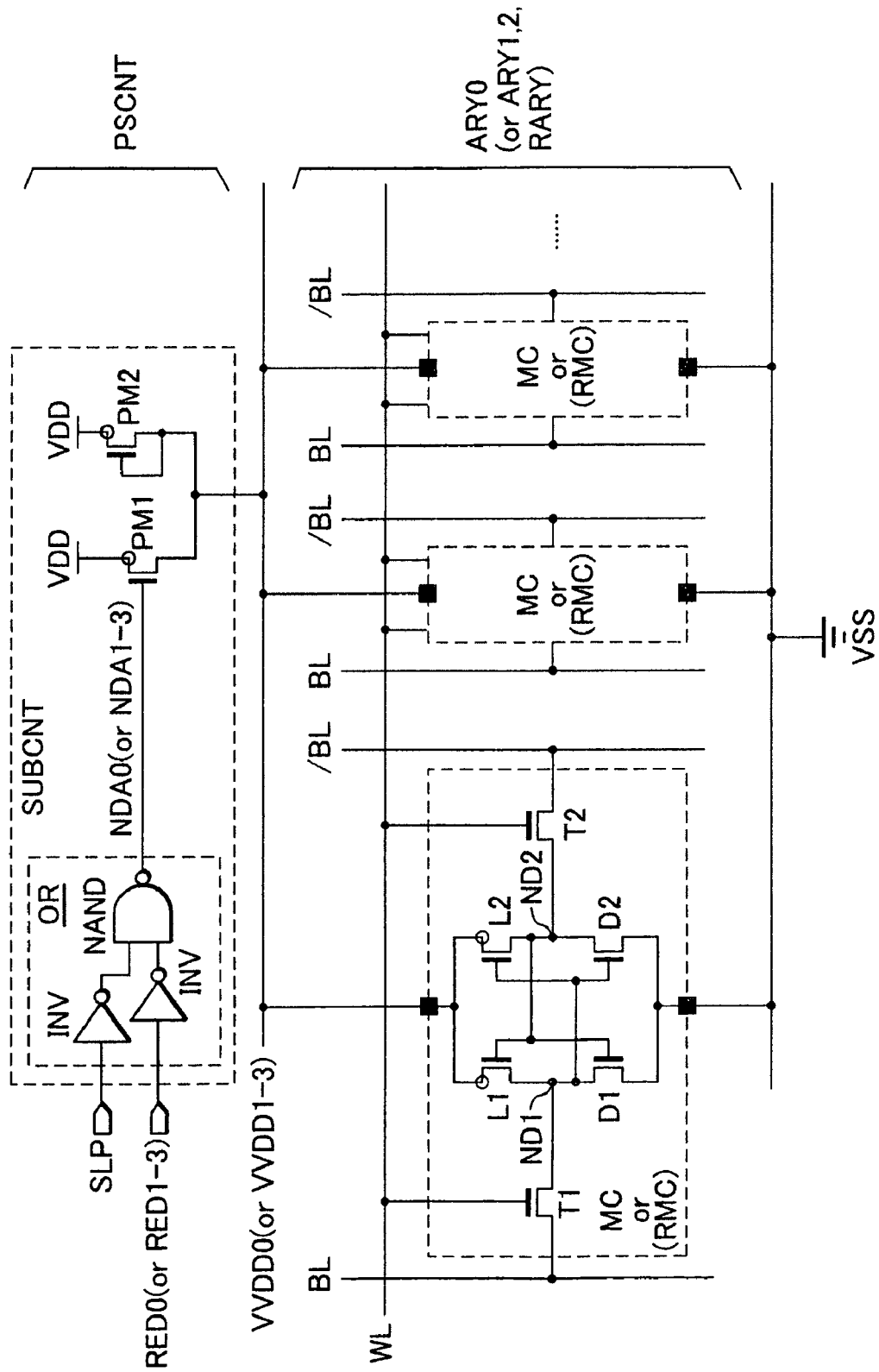
FIG. 14 shows a cell array and a sub control circuit according to the sixth embodiment.

FIG. 14 shows the regular cell arrays ARY0 through ARY2, the redundant cell array RARY and sub control circuit SUBCNT in FIG. 13. Similar members to those in the foregoing third (FIG. 4) and fourth embodiments (FIG. 8) are depicted with the same symbols. The structure of the regular cell arrays ARY0 through ARAY2 and the redundant cell array RARY is similar to each other, however, the regular cell arrays ARY0 through ARAY2 and the redundant cell array RARY have a difference with respect to virtual ground lines VVDD0 through VVDD3 coupled thereto. Power supply terminals (a first terminal and a third terminal) of each regular memory cell MC and each redundant memory cell RMC are coupled to the virtual power supply line VVDD0 (or VVDD0 through VVDD3). Ground terminals (a second terminal and a fourth terminal) of each regular memory cell MC and each redundant memory cell RMC are coupled to a ground line VSS directly. Circuit configurations of the sub control circuits SUBCNT are similar to each other, however, the sub control circuits SUBCNT have differences with respect to virtual ground lines VVDD0 through VVDD3 coupled thereto and the redundant signals RED through RED3 which the sub control circuits SUBCNT receive. The structure of the regular cell arrays ARY0 through ARY2 and the redundant cell array RARY according to the sixth embodiment is the same as that of the regular cell arrays ARY0 through ARY2 and the redundant cell array RARY according to the first embodiment. The structure of the memory cells MC and the redundant memory cells RMC according to the sixth embodiment is the same as that of the memory cells MC and the redundant memory cells RMC according to the first embodiment. Black squares in FIG. 14 indicate power supply terminals of the memory cells MC or the redundant memory cells RMC.

The sub control circuit SUBCNT has a circuit configuration in which an OR circuit is added to the sub control circuit SUBCNT according to the fourth embodiment. The OR circuit includes a NAND gate and a plurality of inverters INV which are coupled to an input of the NAND gate.

The OR circuit sets a control signal NDA0 (or NDA0 through NDA3) to an H level when any of the redundant signal RED0 (or RED0 through RED3) or the sleep signal SLP is at an H level. The sixth embodiment switches off a pMOS transistor PM1 when there is a defective memory cell MC in any of the regular cell arrays ARY0 through ARY2, when the redundant cell array RARY is handled as a defective cell array or when it is the sleep mode SLEEP. The virtual power supply line VDD0 (or VVDD1 through VDD3) is set to a voltage VSS−α. This α is equal to an absolute value of a threshold voltage of a pMOS transistor PM2, and is, for example, zero point five (0.5) V. In actual cases, to reduce a power supply resistance of a virtual ground line VVSS, a multiple pMOS transistors are provided within the sub control circuit SUBCNT.

FIG. 15 shows an operation of the sixth embodiment. Symbols such as circles in FIG. 15 have the same meanings as those shown in FIG. 6. The same description of the operation as that of the fourth embodiment in FIG. 9 is reduced or omitted. Logics of the redundant signals RED0 through RED3 are the same as that of the third embodiment.

The sixth embodiment has a structure in which an operation of the sleep mode SLEEP is added to that of the fourth embodiment (FIG. 9). The operation during a period in which the sleep signal SLP is at the L level (in other words, an operation during a normal operation mode NRML) is the same as that of the normal operation mode according to the fourth embodiment. A power supply voltage VDD (a first power supply voltage) and the ground voltage VSS (a third power supply voltage) are respectively supplied to the power supply terminals (the second and the fourth terminals) and the ground terminals (the first and the second terminals) of the regular memory cells MC in the regular cell array ARY and the redundant cells RMC in the redundant cell array RARY, which are accessed during the normal operation mode NRML. The power supply voltage VDD−α (a second power supply voltage) and the ground voltage VSS (the third power supply voltage) are respectively supplied to the power supply terminals and the ground terminals of the memory cells MC in the regular cell array ARY and the redundant memory cells RMC in the redundant cell array RARY, which are prohibited to access. Logics of the control signals NDA0 through NDA3 during the normal operation mode NRML are the same as inverted logics of the redundant signals /RED0 through /RED3.

The control signals NDA0 through NDA3 are set at the H level during the sleep mode SLEEP (SLPP=H). Regardless of the logics of the redundant signals RED0 through RED3, all the virtual power supply lines VVDD0 through VVDD3 of the regular cell arrays ARY0 through ARY3 and the redundant cell array RARY are set to the power supply voltage VDD−α (the second power supply voltage). A difference between the power supply voltage and the ground voltage supplied to the memory cells MC in the regular cell arrays ARY0 through ARY2 and the memory cells RMC in the redundant cell array decreases, so that a leakage current (a power supply current) is reduced. The sixth embodiment provides the same advantages as those in the foregoing first through fifth embodiments.

Figure 16:
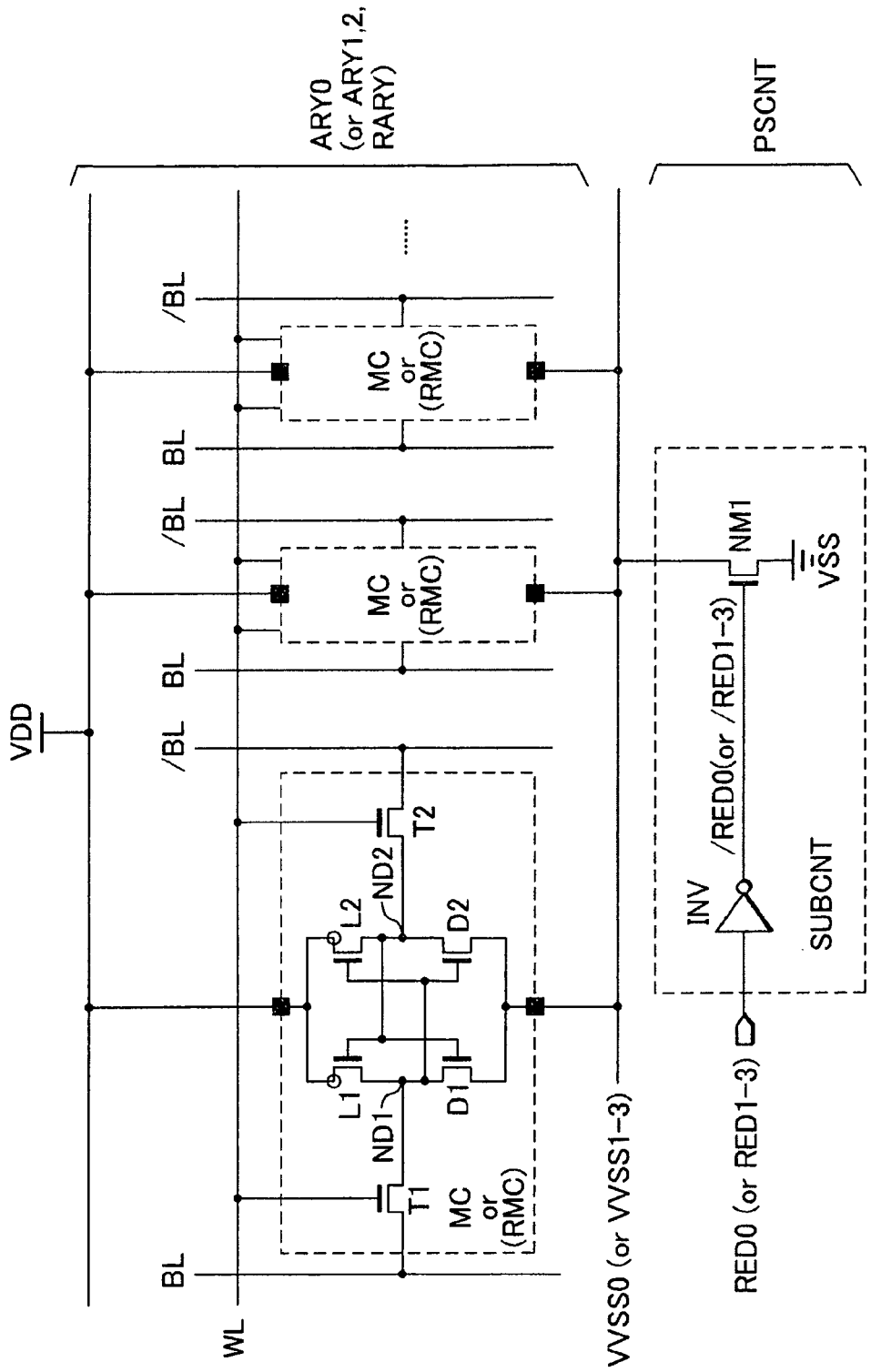
FIG. 16 shows a seventh embodiment.

FIG. 16 indicates a seventh embodiment. Similar members to those in the foregoing first and third embodiments are depicted with the same symbols. A sub control circuit SUBCNT in a power supply control circuit PSCNT according to the seventh embodiment is different from the sub control circuit SUBCNT shown in the third embodiment (FIG. 4). In the seventh embodiment, the structure, other than the above, is the same as that of the third embodiment. For example, a semiconductor memory MEM is an SRAM. The SRAM is provided as a single chip semiconductor. The SRAM is provided on a system LSI along with controllers such as a CPU, as an SRAM macro. An operation of a program circuit PRG in FIG. 16 is the same as that shown in FIG. 5. Black squares in FIG. 16 indicate power supply terminals of regular memory cells MC or redundant memory cells RMC.

The power supply terminals (a second terminal and a fourth terminal) of each of the regular memory cells MC or each of the redundant memory cells RMC are directly coupled to a power supply line VDD. Ground terminals (a first terminal and a third terminal) of each regular memory cell MC and each redundant memory cell RMC are coupled to a virtual ground line VVSS0 (or VVSS1 through VVSS3). The sub control circuit SUBCNT according to the seventh embodiment has a circuit configuration in which an nMOS transistor NM2 is removed from the sub control circuit SUBCNT according to the third embodiment (FIG. 4). In the seventh embodiment, when a redundant signal RED0 (or RED1 through RED3) is at an L level, an nMOS transistor NM1 is switched off to make the virtual ground line VVSS0 (or VVSS1 through VVSS3) an open state (a floating state).

FIG. 17 shows an operation of the seventh embodiment. Symbols such as circles in FIG. 17 have the same meanings as that shown in FIG. 6. The same description of the operation as that of the third embodiment (FIG. 3) is reduced or omitted. Logics of the redundant signals RED0 through RED3 in the seventh embodiment are the same as those in the third embodiment. The seventh embodiment is different from the third embodiment in that the virtual ground lines VVSS3 and VVSS1 are not set to a voltage VSS+α but set to the open state (the floating state). In the seventh embodiment, structure other than the above is the same as that shown in FIG. 6. The seventh embodiment can reduce a leakage current (a power supply current), which flows through the memory cells MC in the unused regular cell array ARY or the redundant memory cells RMC in the unused redundant cell array RARY, close to zero (0), by opening the ground terminal of the regular memory cells MC or the redundant memory cells RMC in the unused cell array ARY (any of ARY0 through ARY2 and RARY). The seventh embodiment provides the same advantages as those in the foregoing first and third embodiments. The seventh embodiment can reduce a consumption current (especially, a standby current) of the regular memory MEM.

Figure 18:
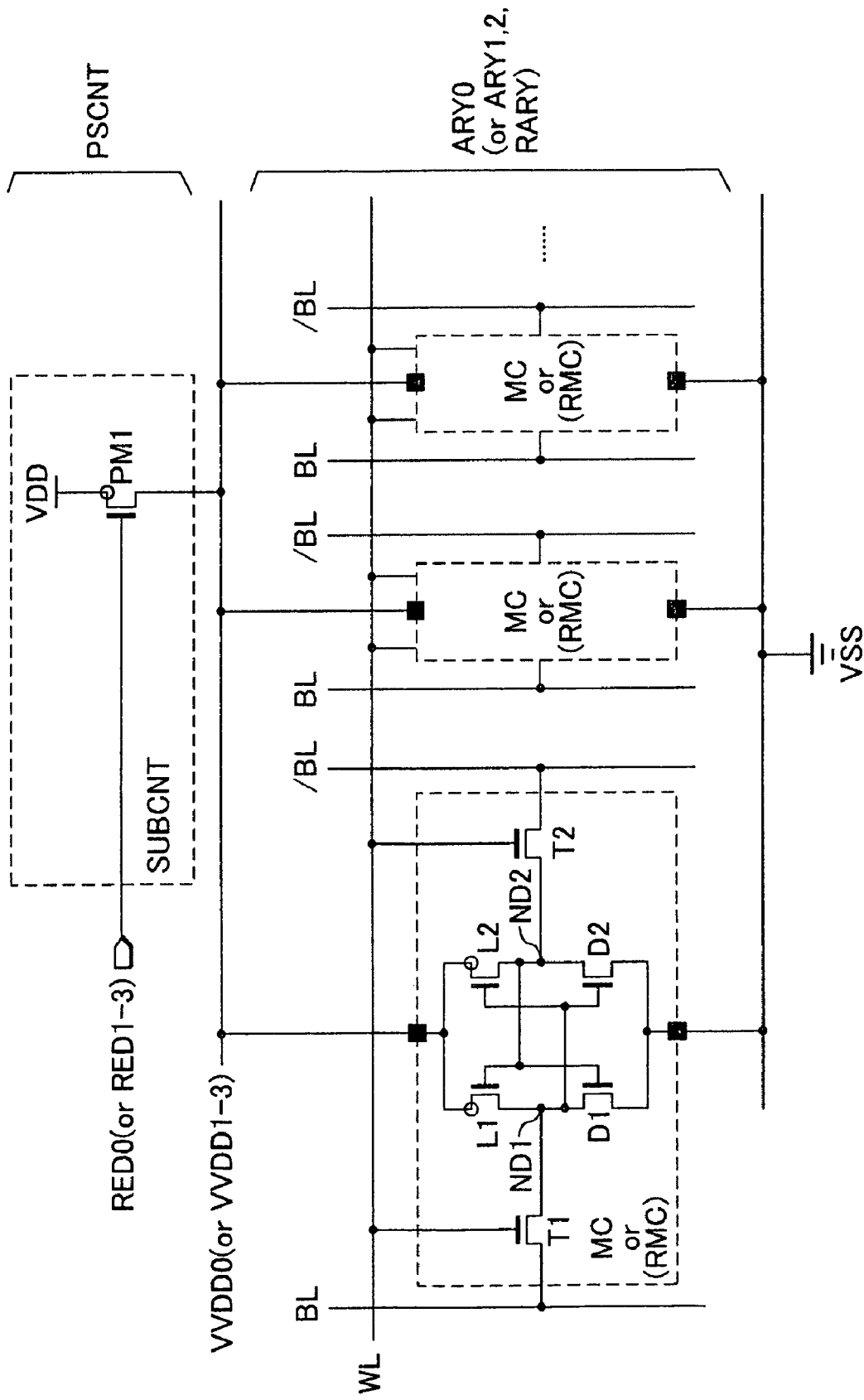
FIG. 18 shows an eighth embodiment.

FIG. 18 shows an eighth embodiment. Similar members to those in the foregoing first, third and fourth embodiments are depicted with the same symbols. In the eighth embodiment, a sub control circuit SUBCNT of a power supply control circuit PSCNT is different from the sub control circuit SUBCNT in the fourth embodiment (FIG. 8). In the eighth embodiment, the structure, other than the above, is the same as that of the fourth embodiment. For example, a semiconductor memory MEM is an SRAM. The SRAM is provided as a single semiconductor chip. The SRAM is provided on a system LSI along with controllers such as a CPU, as an SRAM macro. An operation of a program circuit PRG in FIG. 18 is the same as that shown in FIG. 5. Black squares in FIG. 18 indicate power supply terminals of regular memory cells MC or redundant memory cells RMC.

Power supply terminals (a first terminal and a third terminal) of each of the regular memory cells MC or each of the redundant memory cells RMC are coupled to a virtual power supply line VVDD0 (or VVDD1 through VVDD3). Ground terminals (a second terminal and a fourth terminal) of each of the regular memory cells MC or each of the redundant memory cells RMC are directly coupled to a ground line VSS. The sub control circuit SUBCNT in the eighth embodiment has a circuit configuration in which a pMOS transistor PM2 is removed from the sub control circuit in the fourth embodiment (FIG. 8). In the eighth embodiment, when a redundant signal RED0 (or RED1 through RED3) is at an H level, a pMOS transistor PM1 is switched off so that the virtual power supply line VVDD0 (or VDD1 through VDD3) become the open state (the floating state).

FIG. 19 shows an operation of the eighth embodiment. Symbols such as circles in FIG. 19 have the same meanings as those shown in FIG. 6. The same description of the operation as that of the fourth embodiment (FIG. 9) is reduced or omitted. Logics of the redundant signals RED0 through RED3 are the same as those of the third embodiment. The structure of the eighth embodiment (FIG. 19) is different from that of the fourth embodiment (FIG. 8) in that the virtual power supply lines VVDD1 and VVDD3 are not set to a voltage VDD−α but set to the open state (the floating state). States in the eighth embodiment, other than the above, are the same as those in the fourth embodiment. The eighth embodiment can reduce a leakage current (a power supply current), which flows through the memory cells MC in the unused regular cell array ARY or the redundant memory cells RMC in the unused redundant cell array RARY, close to zero, by opening the power supply terminals of the regular memory cells MC or the redundant memory cells RMC in the unused cell array ARY (any of the ARY0 through ARY2 and RARY). The eighth embodiment provides the same advantages as those in the foregoing first, third and fourth embodiments. The eighth embodiment can reduce consumption current (especially, a standby current) of the memory MEM greatly.

Figure 20:
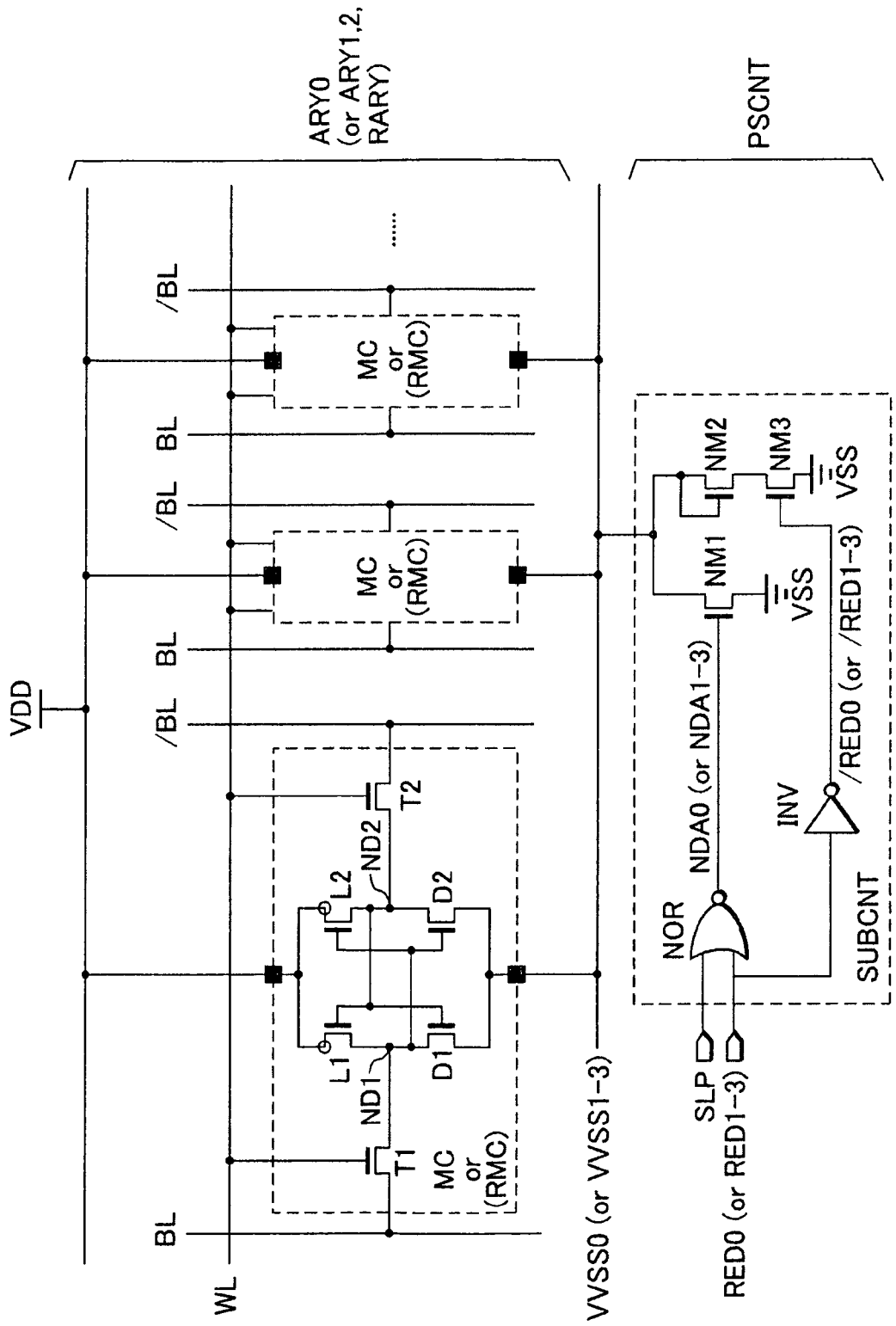
FIG. 20 shows a ninth embodiment.

FIG. 20 shows a ninth embodiment. Similar members to those in the foregoing first, second, third, fifth and seventh embodiments are depicted with the same symbols. In the ninth embodiment, a sub control circuit SUBCNT of a power supply control circuit PSCNT is different from the sub control circuit SUBCNT in the fifth embodiment (FIG. 11). In the ninth embodiment, structure other than the above is the same as that of the fifth embodiment. For example, a semiconductor memory MEM is an SRAM. The SRAM is provided as a single semiconductor chip. The SRAM is provided on a system LSI along with controllers such as a CPU, as an SRAM macro. An operation of a program circuit PRG is the same as that shown in FIG. 5. Black squares in FIG. 20 indicate power supply terminals of regular memory cells MC or redundant memory cells RMC.

Power supply terminals (a second terminal and a fourth terminal) of each of the regular memory cells MC or each of the redundant memory cells RMC are directly coupled to a ground line VSS. Ground terminals (a first terminal and a third terminal) of each of the regular memory cells MC and each of the redundant memory cells RMC are coupled to a virtual ground line VVSS0 (or VVSS1 through VVSS3). The sub control circuit SUBCNT in the ninth embodiment has a circuit configuration in which an nMOS transistor NM3 is added to the sub control circuit SUBCNT in the fifth embodiment. The nMOS transistor NM3 is provided between a source of an nMOS transistor NM2 and the ground line VSS. A gate of the nMOS transistor NM3 receives an inverted logic /RED0 (or /RED1 through /RED3) of a redundant signal RED0 (or RED1 through RED3) through an inverter INV. In the ninth embodiment, when the redundant signal RED0 (or RED1 through RED3) is at an H level, an nMOS transistor NM1 and the nMOS transistor NM3 are switched off so that the virtual ground line VVSS0 (or VVSS1 through VVSS3) become the open state (the floating state).

FIG. 21 shows an operation of the ninth embodiment. Symbols such as circles in FIG. 21 have the same meanings as those shown in FIG. 6. The same description of the operation as that of the fifth embodiment (FIG. 12) is reduced or omitted. Logics of the redundant signals RED0 through RED3 are the same as those of the third embodiment. The ninth embodiment (FIG. 21) is different from the fifth embodiment (FIG. 12) in that the virtual ground lines VVSS1 and VVSS3 are not set to a voltage VDD+α but set to the open state (the floating state). In the ninth embodiment, states other than the above are the same as those in the fifth embodiment. Since the ground terminals of the regular memory cells MC or the redundant memory cells RMC in the unused cell array ARY (any of the ARY0 through ARY2 and RARY) become the open state, the ninth embodiment can reduce a leakage current (a power supply current), which flows through the memory cells MC in the unused regular cell array ARY and the redundant memory cell RMC in the unused redundant cell array RARY, close to zero. The ninth embodiment provides the same advantages as those in the foregoing first, second, third, fifth and seventh embodiments. The ninth embodiment can further reduce a consumption current during a sleep mode SLEEP.

Figure 22:
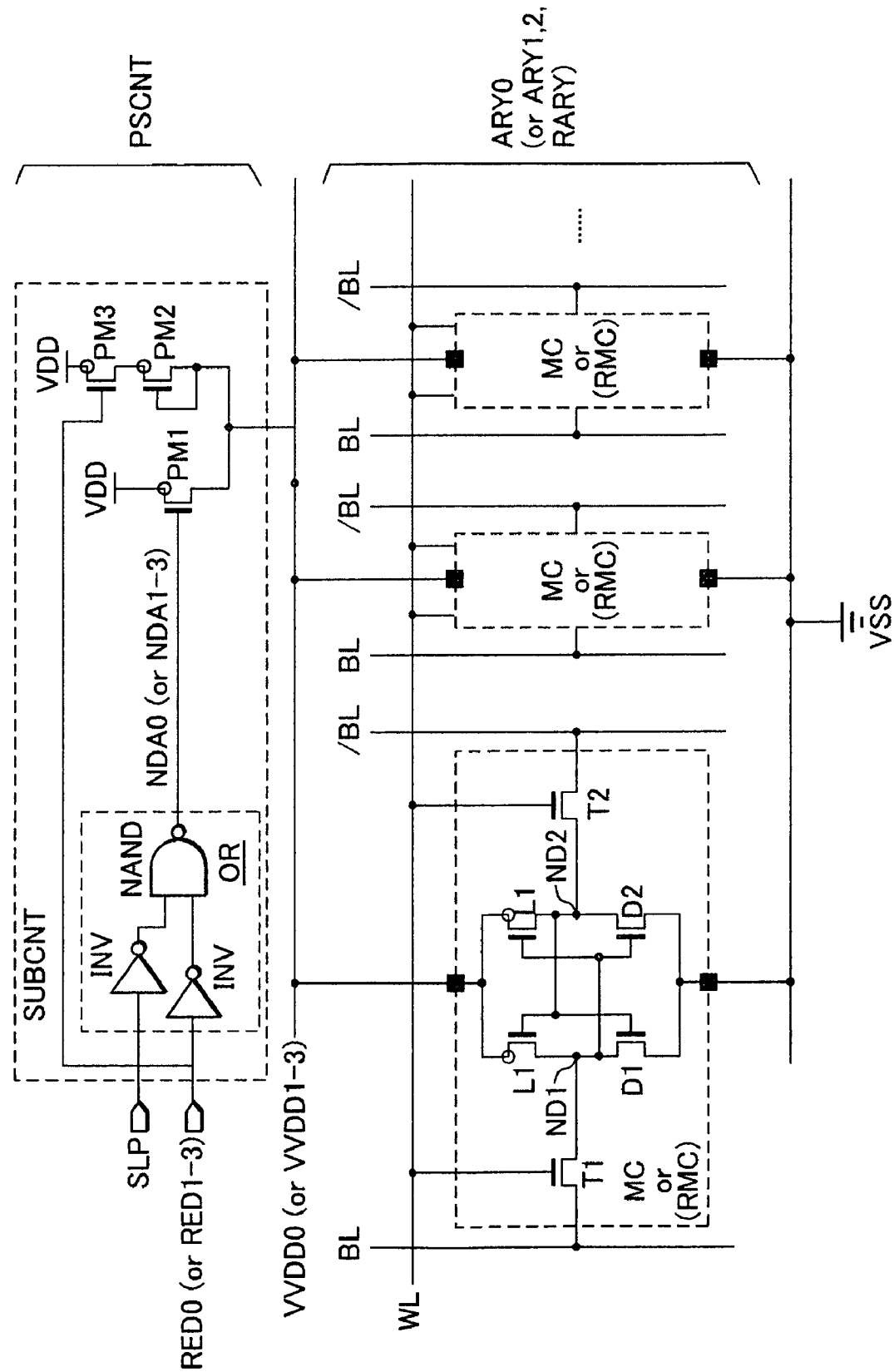
FIG. 22 shows a tenth embodiment.

FIG. 22 shows a tenth embodiment in accordance with aspects of the present invention. Similar members to in the foregoing first through fourth, sixth, and eighth embodiments are depicted with the same symbols. In the tenth embodiment, a sub control circuit SUBCNT in a power supply control circuit PSCNT is different from the sub control circuit SUBCNT in the sixth embodiment (FIG. 14). In the tenth embodiment, the structure, other than the above, is the same as that of the sixth embodiment. For example, a semiconductor memory MEM is an SRAM. The SRAM is provided as a single semiconductor chip. The SRAM is provided on a system LSI along with controllers such as a CPU, as an SRAM macro. An operation of a program circuit PRG in FIG. 22 is the same as that shown in FIG. 5. Black squares in FIG. 22 indicate power supply terminals of regular memory cells MC or redundant memory cells RMC.

Power supply terminals (a first terminal and a third terminal) of each of the regular memory cells MC or each of the redundant memory cells RMC are directly coupled to a virtual power supply line VVDD0 (or VVDD1 through VVDD3). Ground terminals (a second terminal and a fourth terminal) of each of the regular memory cells MC or each of the redundant memory cells RMC are directly coupled to a ground line VSS. The sub control circuit SUBCNT in the tenth embodiment has a circuit configuration in which a pMOS transistor PM3 is added to the sub control circuit SUBCNT in the sixth embodiment. The pMOS transistor PM3 is provided between a source of a pMOS transistor PM2 and the power supply line VDD. A gate of the pMOS transistor PM3 receives a redundant signal RED0 (or RED1 through RED3). In the tenth embodiment, when the redundant signal RED0 (or RED1 through RED3) is at an H level, a pMOS transistor PM1 and the pMOS transistor PM3 are switched off so that the virtual ground line VVDD0 (or VVDD1 through VVDD3) become the open state (the floating state).

FIG. 10 shows an operation of the tenth embodiment. Symbols such as circles in FIG. 23 have the same meanings as those shown in FIG. 6. The same description of the operation as that of the sixth embodiment (FIG. 15) is omitted. Logics of the redundant signals RED0 through RED3 are the same as those of the third embodiment. The tenth embodiment (FIG. 19) is different from the fifth embodiment (FIG. 15) in that the virtual power supply lines VVDD1 and VVDD3 are not set to a voltage VDD−α but set to the open state (the floating state). In the tenth embodiment, states other than the above are the same as those in the sixth embodiment. Since the tenth embodiment makes the power supply terminals of the regular memory cells MC or the redundant memory cells RMC in the unused cell array ARY (any of the ARY0 through ARY2 and RARY) open, the eighth embodiment can reduce a leakage current (a power supply current), which flows through the memory cells MC in the unused regular cell array ARY and the redundant memory cell RMC in the unused redundant cell array RARY, close to zero. The tenth embodiment provides the same advantages as those in the foregoing first through fourth, sixth and eighth embodiments. The tenth embodiment can reduce a consumption current of the memory MEM having a sleep mode SLEEP.

Figure 24:
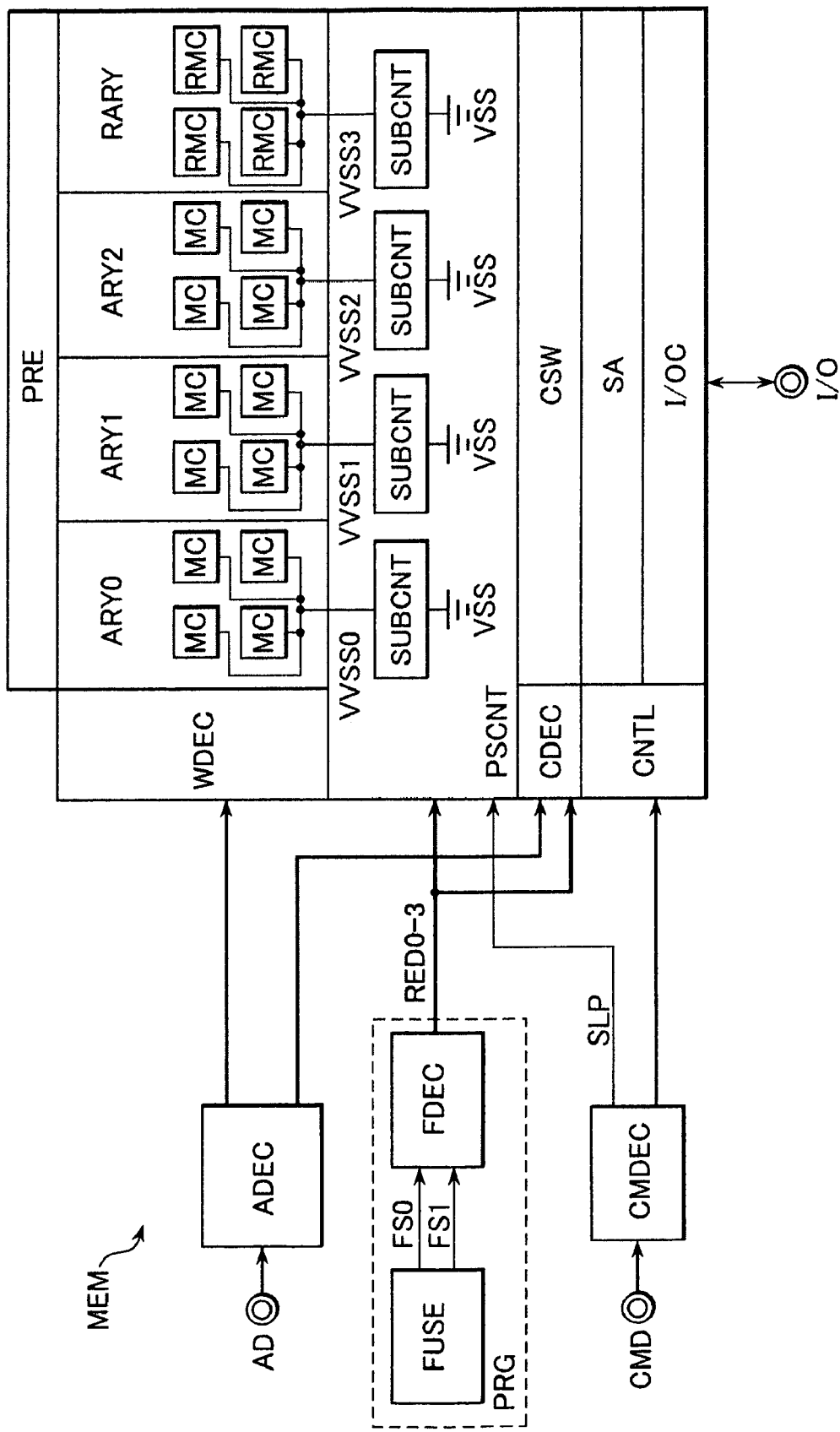
FIG. 24 shows an eleventh embodiment.

FIG. 24 shows an eleventh embodiment. Similar members to those in the foregoing first through third and fifth embodiments are depicted with the same symbols. In the eleventh embodiment, a sleep signal SLP is not supplied via an external terminal but from a command decoder CMDEC. In the eleventh embodiment, the structure, other than the above, is the same as that of the fifth embodiment (FIGS. 10 and 11). An operation of the eleventh embodiment is the same as that shown in FIG. 12.

The command decoder CMDEC in FIG. 24 includes a function to decode a sleep entry command and a sleep exit command supplied to a command terminal, in addition to functions in the third embodiment. The command decoder CMDEC sets the sleep signal SLP to an H level when it receives the sleep entry command. The command decoder CMDEC sets the sleep signal SLP to an L level when it receives the sleep exist command.

A controller (not shown) accessing a semiconductor memory MEM supplies the memory MEM with the sleep entry command during a normal operation mode NRML in which access to regular cell arrays ARY and a redundant cell array RARY is permitted. The memory MEM enters a sleep mode SLEEP that requires less power consumption. The controller supplies the memory MEM with the sleep exit command, during a sleep mode SLEEP in which access to the memory MEM is prohibited. The memory MEM switches from the sleep mode SLEEP to the normal operation mode NRML.

The eleventh embodiment provides the same advantages as those in the foregoing first through third and fifth embodiments. The eleventh embodiment can reduce consumption current (standby current) of the memory MEM that enters the sleep mode SLLEP in response to a command signal CMD. Since the eleventh embodiment does not require the external terminal for receiving the sleep signal SLP, it reduces the chip size of the memory MEM.

In the second through eleventh embodiments, a second power supply voltage (a voltage VSS+α or the voltage VSS−α) is generated within a sub control circuit SUBCNT. The above embodiments are not limited to generation of the second power supply voltage within the sub control circuit SUBCNT. For example, it is possible that the second power supply voltage is supplied, via an external power supply terminal, from outside of the memory MEM that is the same as a first power supply voltage and a third power supply voltage.

The above embodiments use an SRAM including regular memory cells MC and redundant memory cells RMC each having six (6) transistors. The above embodiments are not limited to the SRAM including the memory cells having the six (6) transistors. For example, it is possible to use a two-port SRAM having eight (8) transistor-type memory cells in the above embodiments.

A method of generating the sleep signal SLP in response to the command signal CMD in the eleventh embodiment can be applied to the fifth, sixth, ninth and tenth embodiments. Since applying the above method does not require the external terminal receiving the sleep signal SLP, the chip size of the memory MEM is reduced.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory device comprising:
a regular cell array that includes a regular memory cell to which one of a first power supply voltage and a second power supply voltage is supplied and a third power supply voltage is supplied;
a redundant cell array that includes a redundant memory cell to which one of the first power supply voltage and the second power supply voltage is supplied and the third power supply voltage is supplied; and
a power supply control circuit that controls supply of the first power supply voltage and the second power supply voltage to the regular cell array and the redundant cell array,
wherein a difference between the second power supply voltage and the third power supply voltage is smaller than a difference between the first power supply voltage and the third power supply voltage,
wherein the power supply control circuit supplies the regular cell array with the first power supply voltage and supplies the redundant cell array with the second power supply voltage when the redundant cell array is unused, and
wherein the power supply control circuit supplies the regular cell array with the second power supply voltage and supplies the redundant cell array with the first power supply voltage when the redundant cell array is used.

2. The semiconductor memory device according to claim 1, wherein the power supply control circuit includes a MOS transistor, and wherein the second power supply voltage is a voltage obtained by adding a threshold voltage of the MOS transistor to the third power supply voltage.

3. The semiconductor memory device according to claim 1, wherein the power supply control circuit includes a plurality of sub control circuits corresponding to the regular cell array and the redundant cell array, and the sub control circuit controls the supply of one of the first power supply voltage and the second power supply voltage to one of the regular cell array and the redundant cell array, in response to a redundant signal which indicates whether the regular cell array is replaced by the redundant cell array.

4. The semiconductor memory device according to claim 3, wherein the sub control circuit supplies the regular cell array with the second power supply voltage when the redundant signal indicates that the regular cell array is replaced by the redundant cell array, and wherein the sub control circuit supplies the regular cell array with the first power supply voltage when the redundant signal indicates that the regular cell array is not replaced by the redundant cell array.

5. The semiconductor memory device according to claim 3, wherein the redundant signal is obtained by decoding a signal supplied from a fuse circuit.

6. The semiconductor memory device according to claim 3, wherein the regular memory cell includes:
a first terminal that receives one of the first power supply voltage and the second power supply voltage; and
a second terminal that receives the third power supply voltage, wherein the redundant memory cell includes:
a third terminal that receives one of the first power supply voltage and the second power supply voltage; and
a fourth terminal receives the third power supply voltage, wherein each of the sub control circuits includes:

a first transistor, a source of which receives the first power supply voltage, a drain of which is coupled to the first terminal and the third terminal and a gate of which receives the redundant signal; and
a second transistor, a source of which receives the first power supply voltage and a gate and a drain of which are coupled to the first terminal and the third terminal.

7. The semiconductor memory device according to claim 1, wherein the power supply control circuit supplies the regular cell array and the redundant cell array with the second power supply voltage during a sleep mode in which access to one of the regular memory cell and the redundant memory cell is prohibited.

8. The semiconductor memory device according to claim 1, wherein the power supply control circuit includes a plurality of sub control circuit corresponding to the regular cell array and the redundant cell array and the sub control circuit controls the supply of one of the first power supply voltage and the second power supply voltage, in response to an operation mode signal.

9. The semiconductor memory device according to claim 8, wherein the sub control circuit supplies the regular cell array with the second power supply voltage when the operation mode signal indicates a sleep mode in which access to one of the regular memory cell and the redundant memory cell is prohibited.

10. The semiconductor memory device according to claim 8, wherein the regular memory cell includes:
a first terminal that receives one of the first power supply voltage and the second power supply voltage; and
a second terminal that receives the third power supply voltage, wherein the redundant memory cell includes:
a third terminal that receives one of the first power supply voltage and the second power supply voltage; and
a fourth terminal that receives the third power supply voltage, and wherein each of the sub control circuits includes:
a first transistor, a source of which receives the first power supply voltage, a drain of which is coupled to the first terminal and the third terminal and a gate of which receives a signal in response to the operation mode signal; and
a second transistor, a source of which receives the first power supply voltage, and a drain and a gate of which are coupled to the first terminal and the third terminal.

11. The semiconductor memory device according to claim 10, further comprising:
a logic circuit that performs a logic operation on the operation mode signal and the redundant signal,
wherein an output signal of the logic circuit is supplied to the gate of the first transistor.

12. A method of controlling a semiconductor memory device, comprising:
outputting a first signal when there is no defective regular memory cell in a regular cell array;
outputting a second signal when there is a defective regular memory cell in the regular cell array;
supplying the regular cell array with a first power supply voltage and a redundant cell array including a redundant memory cell with a second power supply voltage, in response to the first signal;
supplying the regular cell array with the second power supply voltage and the redundant cell array including the redundant memory cell with the first power supply voltage, in response to the second signal; and supplying the regular cell array and the redundant cell array with a third power supply voltage, wherein a difference between the second power supply voltage and the third power supply voltage is smaller than a difference between the first power supply voltage and the third power supply voltage.

13. The method of controlling the semiconductor memory device according to claim 12, further comprising:

receiving an operation signal indicating an operation; and supplying the regular cell array and the redundant cell array with the second power supply voltage when the operation signal indicates a sleep mode in which access to one of the regular memory cell and the redundant memory cell is prohibited.

14. The method of controlling the semiconductor memory device according to claim 12, wherein the redundant cell array is used instead of the regular cell array when the second signal is output.

* * * * *